(12) United States Patent
Osiander et al.

(10) Patent No.: US 7,416,019 B2
(45) Date of Patent: Aug. 26, 2008

(54) THERMAL INTERFACE AND SWITCH USING CARBON NANOTUBE ARRAYS

(75) Inventors: Robert Osiander, Ellicott City, MD (US); Jennifer L. Sample, Bethesda, MD (US)

(73) Assignee: The Johns Hopkins University, Baltimore, MD (US)

( * ) Notice: Subject to any disclaimer, the term of this patent is extended or adjusted under 35 U.S.C. 154(b) by 567 days.

(21) Appl. No.: 10/916,730

(22) Filed: Aug. 11, 2004

(65) Prior Publication Data
US 2005/0037204 A1    Feb. 17, 2005

Related U.S. Application Data

(60) Provisional application No. 60/494,938, filed on Aug. 13, 2003.

(51) Int. Cl.
*F28F 27/00* (2006.01)
(52) U.S. Cl. .......................... 165/96; 977/734; 977/742; 977/939
(58) Field of Classification Search .................. None
See application file for complete search history.

(56) References Cited

U.S. PATENT DOCUMENTS

| 6,119,573 | A | 9/2000 | Berens et al. |
| 6,232,706 | B1 * | 5/2001 | Dai et al. ..................... 977/939 |
| 6,445,006 | B1 * | 9/2002 | Brandes et al. ............. 977/742 |
| 6,574,130 | B2 * | 6/2003 | Segal et al. .................. 977/734 |
| 6,713,151 | B1 | 3/2004 | Dean et al. |
| 2002/0100581 | A1 | 8/2002 | Knowles et al. |
| 2003/0077478 | A1 | 4/2003 | Dani et al. |
| 2003/0111333 | A1 | 6/2003 | Montogmery et al. |
| 2003/0117770 | A1 | 6/2003 | Montgomery et al. |
| 2003/0150604 | A1 | 8/2003 | Koning et al. |
| 2003/0231471 | A1 | 12/2003 | De Lorenzo et al. |
| 2004/0009353 | A1 | 1/2004 | Knowles et al. |
| 2004/0071870 | A1 | 4/2004 | Knowles et al. |

* cited by examiner

*Primary Examiner*—Ljiljana (Lil) V Ciric
(74) *Attorney, Agent, or Firm*—Francis A. Cooch

(57) ABSTRACT

Thermal interfaces and methods include an array of carbon nanotubes aligned substantively perpendicularly from a substrate. One method includes arranging metal catalyst particles with a particular ligand on a fluid surface of a Langmuir-Blodgett trough. This forms uniformly spaced particles with spacing based on the particular ligand. The uniformly spaced metal catalyst particles are deposited on a substrate and carbon nanotubes are grown on the particles using chemical vapor deposition. A thermal interface can be produced with a carbon nanotube packing ratio greater than fifty percent and used in a thermal switch or other device. In some methods, commercially available nanotubes are condensed on a substrate using carbon nanotubes with terminal carboxylic acids in solution and an amine monolayer on the substrate. Pretreatment of the nanotubes in a switch by applying heavy pressure between two surfaces results in good thermal conductivity between those surfaces at smaller operating pressures.

17 Claims, 17 Drawing Sheets

210 METAL PLATE
220 METAL PLATE
205 RELATIVE MOVEMENT OF PLATES

227 GAPS
210
220
225 CONTACT POINTS 210
205
220
250 ARRAY OF ALIGNED CARBON NANOTUBES

255 CONTACT POINTS
220
210
250 ARRAY OF ALIGNED CARBON NANOTUBES

410
CARBON
NANOTUBES

420
CONGEALED
PYRAMIDS OF
CARBON
NANOTUBES
AFTER
PRESSURE
PRETREATMENT

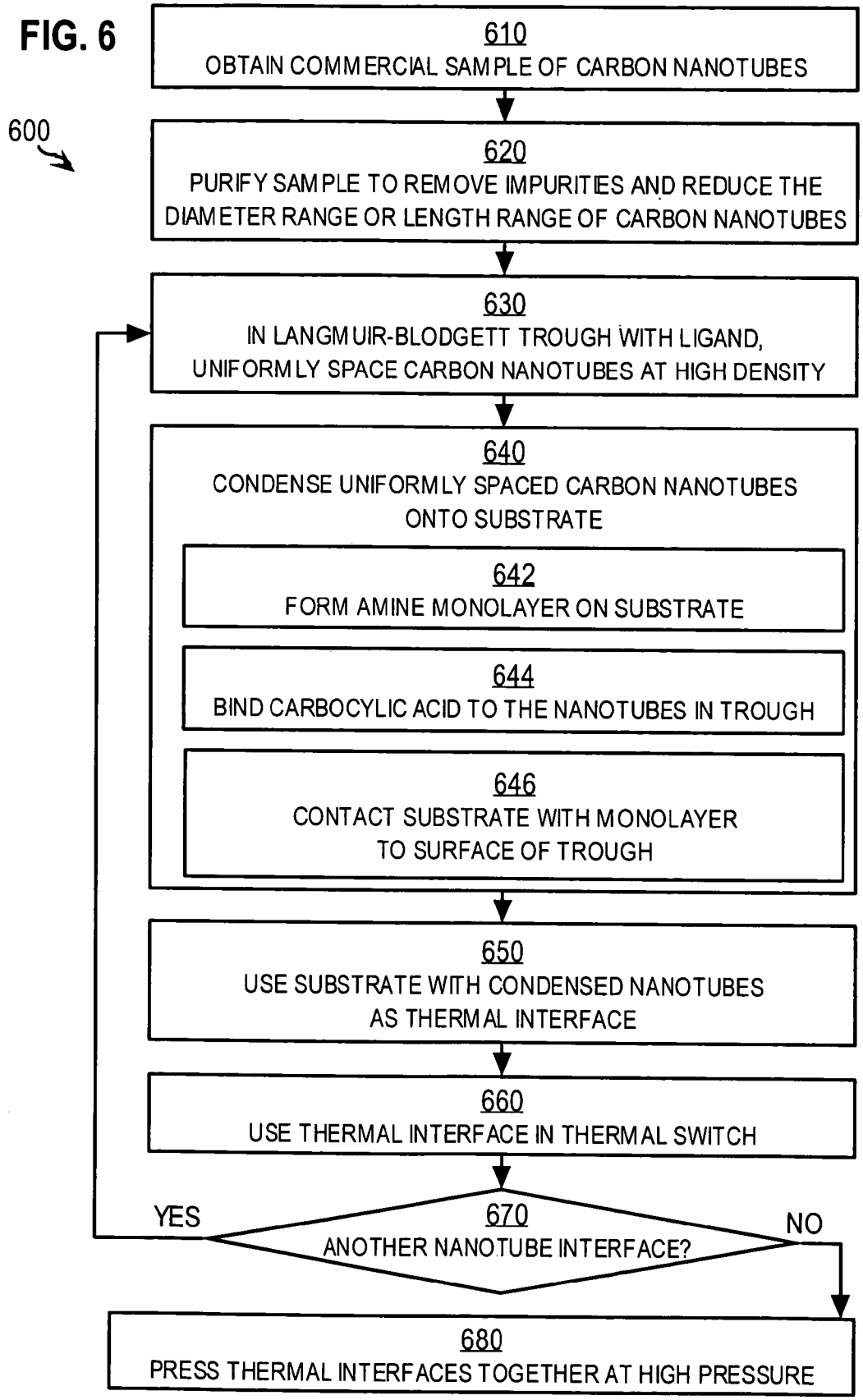

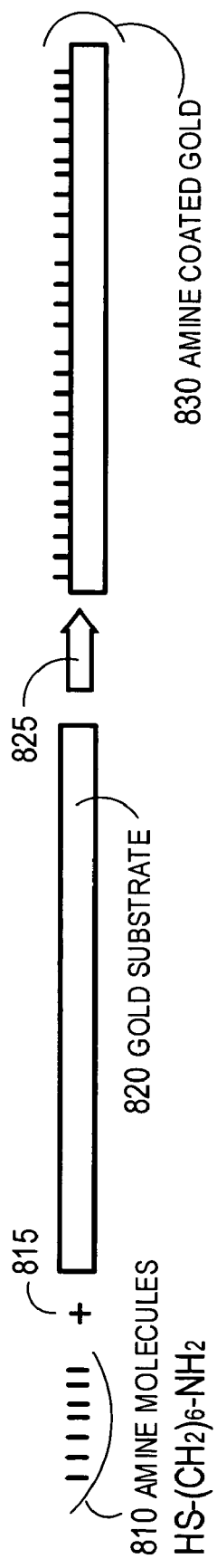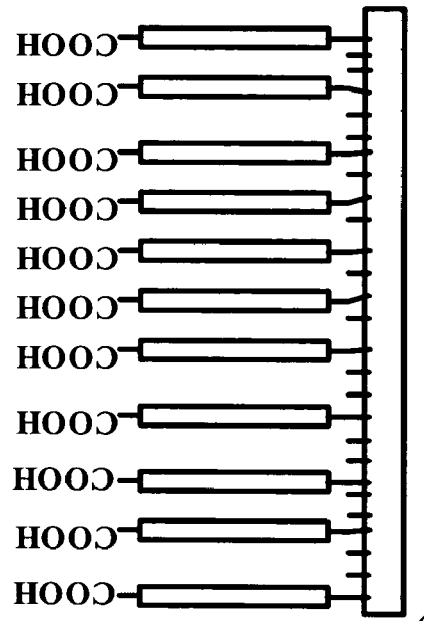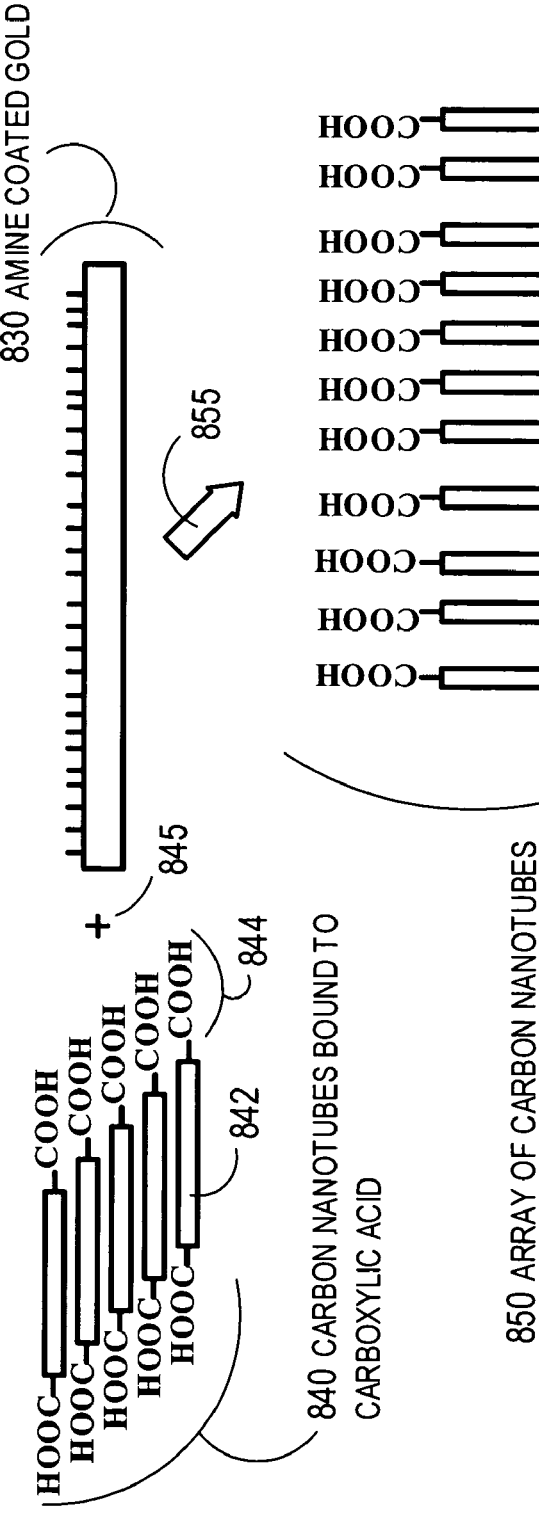
FIG. 8A
FIG. 8B

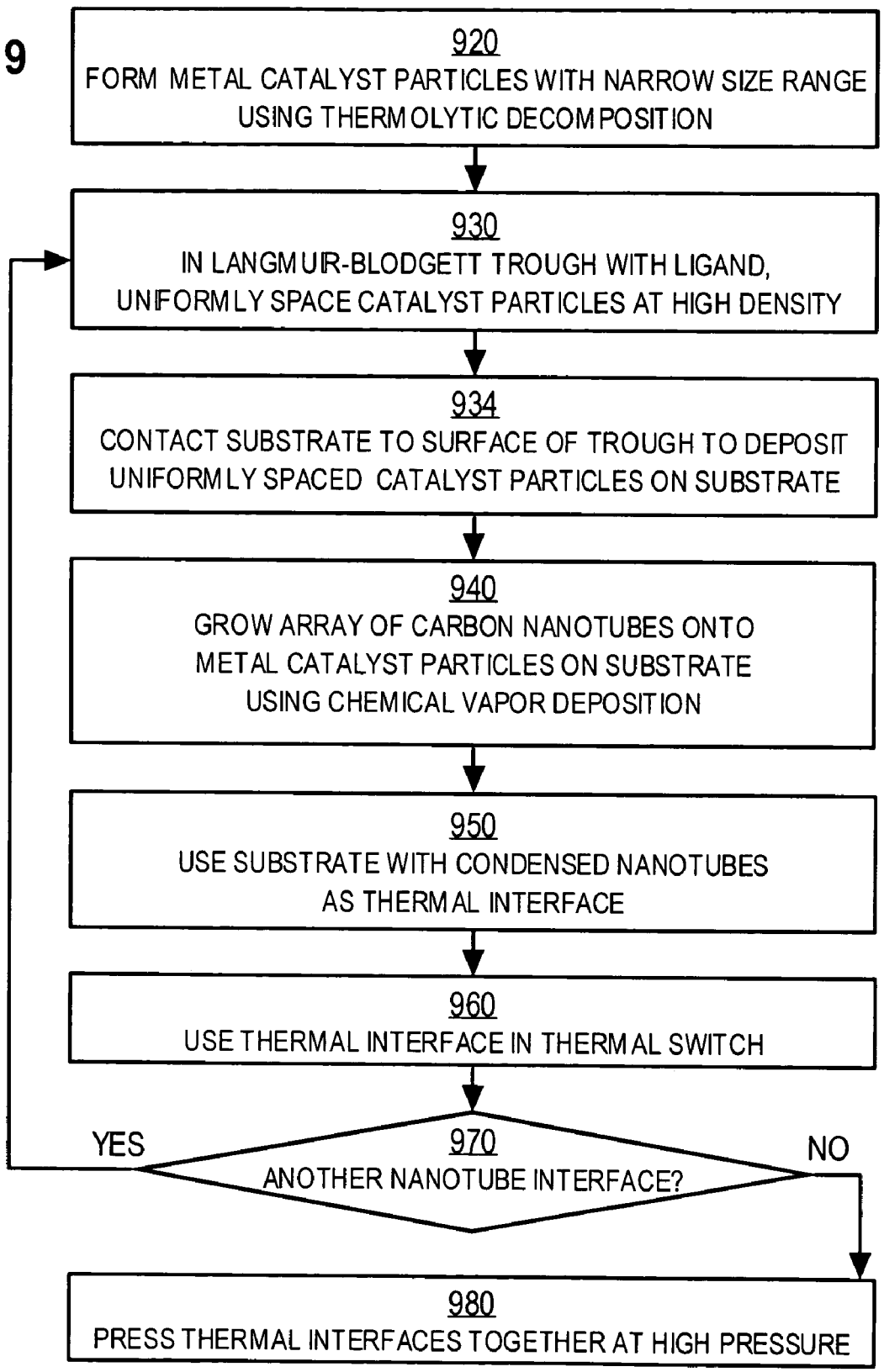

1001 SCALE
1002 ARRANGED CATALYST PARTICLES

1010 DENSELY-PACKED CARBON NANOTUBES

1011 SCALE

1012 DENSELY-PACKED CARBON NANOTUBES

1013 SCALE

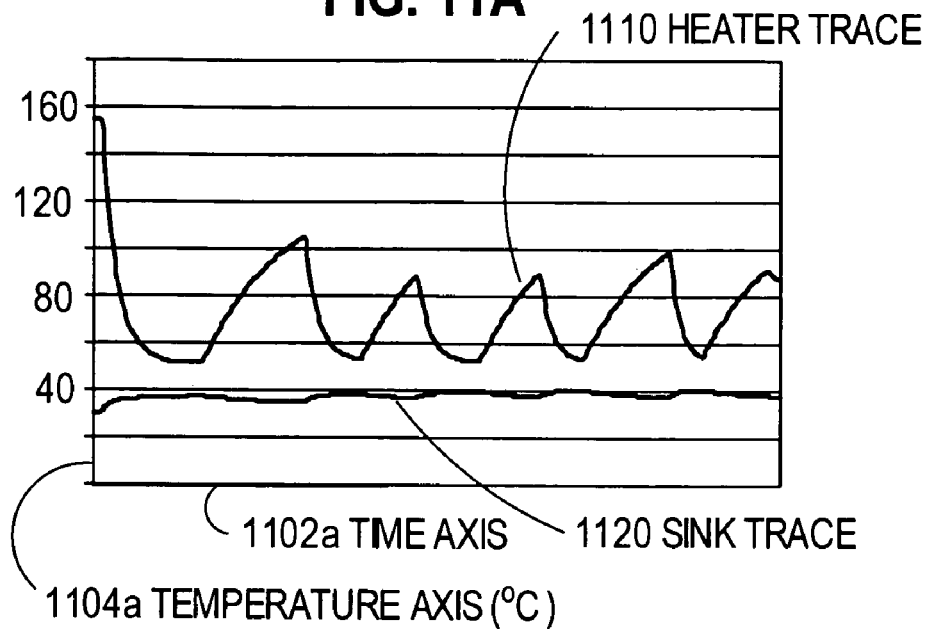
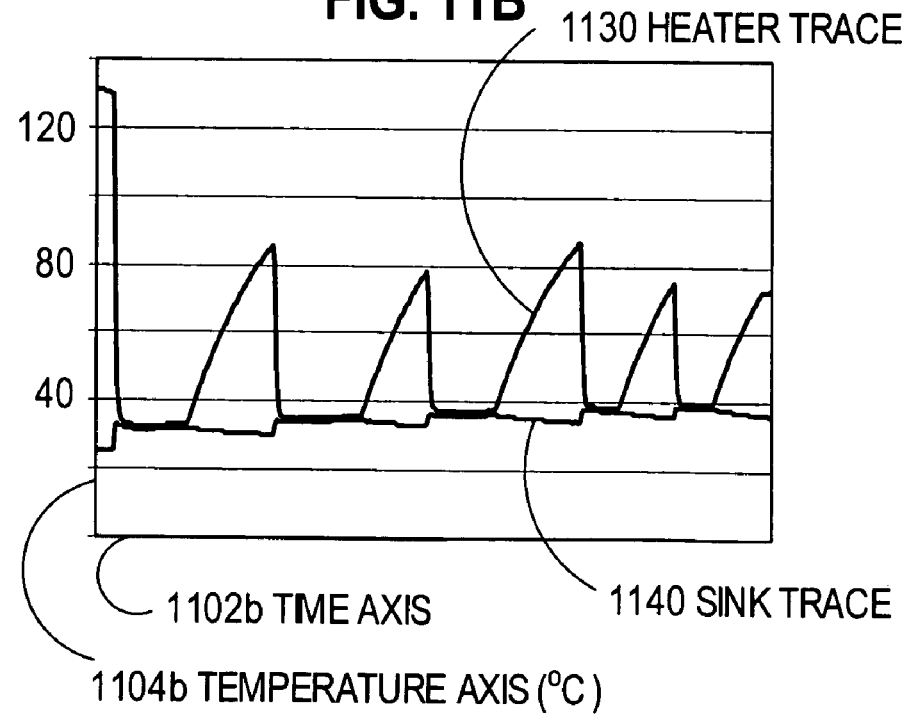

THERMAL INTERFACE AND SWITCH USING CARBON NANOTUBE ARRAYS

CROSS-REFERENCE TO RELATED APPLICATIONS

This application claims benefit of Provisional Appln. 60/494,938, filed Aug. 13, 2003, the entire contents of which are hereby incorporated by reference as if fully set forth herein, under 35 U.S.C. §119(e).

BACKGROUND OF THE INVENTION

1. Field of the Invention

The present invention relates to using carbon nanotubes in a thermal interface to increase the heat flow between two surfaces, and, in particular, to using arrays of aligned or densely packed carbon nanotubes to improve thermal contact in a reusable thermal interface, such as a thermal interface for use in a thermal switch.

2. Description of the Related Art

There are many applications that benefit from increasing heat flow between two surfaces. Heat transport is accomplished by phonons, quantized modes of vibration occurring in a rigid crystal lattice, such as the atomic lattice of a solid. The flow of heat between two surfaces depends on how well these phonons couple from one surface to the other, the inverse of which is described by the thermal contact resistance. The thermal contact resistance depends how well the two surfaces are bonded together. In many applications, however, the surfaces could be of different materials or fabricated with temperature restrictions, such as for electronic components, which can reduce the quality of the bond between the surfaces, and therefore increase the thermal resistance In many applications the surfaces can not be bonded for functional reasons. For example, in a device that is subjected to alternating heating and cooling, the device may be connected thermally to a radiator to dissipate excess heat during a heating time interval, but disconnected to preserve heat, or thermally connected to a heat source, during a cooling interval. For example, such control of heating and cooling is required on a spacecraft, to balance heating from power dissipation within the spacecraft and from exposure to the sun, and to balance cooling during an eclipse while in the shadow of earth, or another planet. A thermal switch can be used to connect the device to a radiator to cool the device during a heating interval and to disconnect the device from the radiator to preserve heat during a cooling interval. The thermal switch may include two plates that separate to reduce heat flow to the radiator and that come into thermal contact to allow heat flow to the radiator.

When separate surfaces are brought into contact, heat flow between the surfaces, per unit area, depends, among other factors, on the fraction of that area in contact that allows phonons to couple from one surface to the other. One way to increase the area in contact is to highly polish the surfaces and ensure they are absolutely flat. However, even highly polished surfaces are rough at some length scale and the fractional area of contact is always less than one. In some approaches, the two surfaces are forced together under pressure, which increases the fractional area of contact. However, this approach is of limited effectiveness when the surfaces are made of rigid materials, such as copper or diamond, that do not deform sufficiently under the pressures that can be applied in practical circumstances.

Heat flow can occur not only at the contact areas, but also across the gap between the surfaces, via radiative heat transfer, thermal conduction or convection in the interstitial medium. However, there is no conductive or convective transfer of heat in vacuum.

In some approaches, the gaps are filled with an epoxy that permanently binds to the surfaces of both surfaces. The epoxy fills the gaps and provides a solid medium for the transfer of heat. Using this approach, the heat flow is controlled by the conductivity of the epoxy. The thermal conductivity of the epoxy can be increased by including conductive materials in the epoxy, such as metallic or diamond particles, carbon or graphite fibers. Graphite is a layered structure of carbon that is very thermally conductive in the plane of each layer. While suitable for many purposes, the use of an epoxy is unsuitable as a reusable thermal interface in which the two surfaces separate under some circumstances, such as in a thermal switch.

In some approaches, thermally conductive grease is applied to the contact surface of one or both surfaces. While grease allows the surfaces to be separated, adhesion and flow properties of the grease generally involve relatively large separation of the surfaces to break thermal contact. Grease may not be practical for devices that repeatedly break and establish thermal contact or in small devices such as microelectromechanical (MEMS) devices.

Other highly conductive materials also have limitations with respect to utility as a thermal interface in a thermal switch. Diamond is known to have very high thermal conductivity. However, diamond is very rigid and does not conform to fill gaps in a surface; and it is very expensive. Thermal conductivity varies with temperature and isotopic purity from about 600 to about 2600 Watts per meter per Kelvin (W/m·K). Isotopically pure diamond produced by chemical vapor deposition (CVD) is brittle.

Carbon fiber, such as K-1100, is a material known to have relatively high thermal conductivity, but not as high as diamond. Commercially available carbon fibers are made from pitch or Polyacrylonitrile (PAN) precursor material and drawn onto fiber tow. Pitch fibers are treated to form graphite structures ("graphitized") by heating to high temperatures, near 3000° C. Overall thermal conductivity can be as high as 200 W/m·K.

Some thermal interfaces use carbon fibers, which can achieve thermal conductivities of 200 W/m·K along the fiber direction, arranged as a velvet on one or both surfaces. In some approaches, the carbon fibers are saturated with a phase change material (PCM) to conform to an uneven surface. A PCM changes from solid to liquid near some operating temperatures. In some approaches, the carbon fibers of the velvet are held erect in an epoxy or PCM on one surface and protrude above the epoxy or PCM to contact the other surface. For some applications carbon fibers can not be packed densely enough to provide sufficient thermal conductivity. Furthermore, carbon fibers are subject to bending and breakage, and may not be suitable for a thermal interface that is frequently reused or exposed to excess pressure.

Carbon nanotubes are large carbon molecules that are each akin to a graphite sheet rolled into a closed cylinder with a diameter of a few to tens of nanometers (nm, 1 nm=$10^{-9}$ meters, m) and lengths of hundreds of nanometers to several micrometers ($\mu$m, 1 $\mu$m=$10^{-6}$ m) or more. One or both ends are capped with a hemisphere of carbon atoms. Carbon nanotubes can be formed having one wall (single walled nanotubes, SWNT) or multiple co-axial walls (multiple walled nanotubes, MWNT). The thermal conductivity along the axis of a SWNT is higher than the thermal conductivity of diamond; SWNT thermal conductivity has theoretical values ranging from about 6,600 W/m·K to 37,000 W/m·K. A single MWNT has been measured to have a thermal conductivity of about 3000 W/m·K. Carbon nanotubes are strong and ductile and can compress under pressure without breaking and with less bending than carbon fibers. However, arrays of aligned carbon nanotubes in a configuration to provide thermal and mechanical advantages for a thermal interface are difficult to achieve.

In some approaches, carbon nanotubes are included in a thermal interface, alone or on the tips of larger carbon fibers arranged in a velvet (see for example, Timothy R. Knowles and Christopher L. Seaman, United States Patent Application Publication US 2002/0100581, Aug. 1, 2002, hereinafter "Knowles"). However, the nanotubes in Knowles are not densely packed. Packing ratios only up to about 50% are proposed. Therefore thermal conductivity of these interfaces does not approach the conductivity along the axis of nanotubes as closely as would more densely packed nanotubes. Knowles shows the construction of mops of tangled MWNT that have diameters of about 1 μm, or powders of non-continuous carbon nanotubes, deposited on the tips of carbon fibers with diameters greater than 3 μm. These structures can not achieve the thermal conductivity of MWNT between the two surfaces because heat has to pass through many different nanotubes and then through the lower conductivity carbon fiber.

Clearly, there is a need for a reusable thermal interface that increases heat flow between two surfaces over the heat flow attainable from the two surfaces in mechanical contact, and which does not suffer the disadvantages of prior art approaches.

SUMMARY OF THE INVENTION

Techniques are provided for using arrays of substantively aligned carbon nanotubes, such as in thermal interfaces and thermal switches, which do not suffer the disadvantages of prior art approaches.

In one set of embodiments, a thermal interface includes a first structure for making thermal contact with a second, different structure. Multiple aligned carbon nanotubes protrude perpendicularly from an active area of a first surface of the first structure. The nanotube packing ratio is greater than fifty percent. A nanotube packing ratio is a quotient of a sum of cross section areas of the carbon nanotubes divided by the active area.

In some of these embodiments, metal catalyst particles are fixed to the first surface, and each carbon nanotube is bound to a metal catalyst particle. In some of these embodiments, the metal catalyst particles are regularly spaced on the active area with a minimum spacing of less than about 20 nanometers center to center. In some of these embodiments, each metal catalyst particle is an iron nanoparticle having a diameter less than about 20 nanometers.

In another set of embodiments, a method for fabricating an array of carbon nanotubes on a surface of a substrate includes arranging metal catalyst particles on a fluid surface of a Langmuir-Blodgett trough to form uniformly spaced metal catalyst particles. The particles are capped with a particular ligand which affects the spacing of the metal catalyst particles. The uniformly spaced metal catalyst particles are deposited on a substrate. Using chemical vapor deposition, an array of carbon nanotubes are grown on at least some of the uniformly spaced metal catalyst particles deposited on the substrate to form an array of carbon nanotubes that are substantively aligned perpendicularly to the first surface and substantively uniformly spaced.

In some of these embodiments, the metal catalyst particles are formed with a narrow size distribution by using thermolytic decomposition.

In some embodiments, the substrate with the aligned carbon nanotubes is used in a thermal interface. In some embodiments, the substrate is used in a thermal switch. In such embodiments, the substrate is used as at least one thermal interface of two thermal interfaces mounted with respect to each other to produce a plurality of states, including a contact state in which the two thermal interfaces are in thermal contact and a non-contact state in which the two thermal interfaces are not in thermal contact.

According to another set of embodiments, a method for fabricating an array of carbon nanotubes includes condensing a plurality of carbon nanotubes with terminal carboxylic acids on their open ends from solution onto a substrate. The condensation reaction includes forming an amine monolayer on a first surface of the substrate; and immersing the first surface of the substrate in the solution to form an array of carbon nanotubes that are substantively aligned perpendicularly to the first surface.

In some of these embodiments, a sample of carbon nanotubes is purified to remove impurities or separate carbon nanotubes by length or diameter to form a solution of carbon nanotubes with terminal carboxylic acids on their open ends, before condensing the carbon nanotubes.

In some embodiments, the substrate with the aligned carbon nanotubes is used in a thermal switch. In such embodiments, the substrate is used as at least one thermal interface of two thermal interfaces mounted with respect to each other to produce a plurality of states, including a contact state in which the two thermal interfaces are in thermal contact at an operative pressure, and a non-contact state in which the two thermal interfaces are not in thermal contact.

In some of these embodiments, the two thermal interfaces are brought into contact under a pretreatment pressure substantively greater than the operative pressure.

In another set of embodiments, a thermal switch includes a first structure and a second structure. An array of carbon nanotubes are substantively aligned perpendicularly from an active area of a first surface of the first structure. The second structure is mounted relative to the first structure for selecting among states, including a contact state in which the second structure contacts the plurality of carbon nanotubes at an operative pressure and a non-contact state in which the second structure does not contact any carbon nanotube in the plurality of carbon nanotubes.

In another set of embodiments, a thermal switch includes a first structure and a second structure. An array of carbon nanotubes are substantively aligned perpendicularly from an active area of a first surface of the first structure. The second structure is mounted relative to the first structure for selecting among states, including a contact state in which the second structure contacts the plurality of carbon nanotubes at an operative pressure and a non-contact state in which the second structure does not contact any carbon nanotube in the plurality of carbon nanotubes. The aligned carbon nanotubes are pretreated by bringing the second structure into contact with the aligned carbon nanotubes under a pretreatment pressure substantively greater than the operative pressure.

In another set of embodiments, a method is provided for fabricating a thermal switch operated by repeatedly alternating between separating a first interface from a second interface and pressing the first interface and the second interface together at an operative pressure. The method includes forming a first interface including an array of carbon nanotubes and forming a second interface. The first interface and the second interface are pressed together at a pretreatment pressure substantially greater than the operative pressure and then separated.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 is a flow chart that illustrates a method for forming aligned carbon nanotubes, according to an embodiment;

FIG. 8A and FIG. 8B are block diagrams that illustrate chemical attachment of carbon nanotubes to a gold substrate, according to an embodiment;

FIG. 9 is a flow chart that illustrates a method for forming aligned carbon nanotubes, according to another embodiment;

FIG. 11A is a graph that illustrates response of a mechanical thermal switch using copper surfaces, according to an embodiment;

FIG. 11B is a graph that illustrates response of a mechanical thermal switch using carbon nanotubes, according to an embodiment;

DETAILED DESCRIPTION

A method and apparatus for using carbon nanotubes are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Embodiments of the invention are described in the context of thermal interfaces in thermal switches, but the invention is not limited to this context. In other embodiments, the invention provides an array of carbon nanotubes for any purpose, including, but not limited to, a fixed thermal interface between fixed components in electric circuits or other devices, for structural components such as in micro-electromechanical systems (MEMS), or for electrical conductivity between switched or un-switched components. In some embodiments, such arrays are use in electronics packaging applications, for example, as a conductive interconnect or as a low-weight heat spreading or channeling component. Arrays of oriented carbon nanotubes are used in some embodiments as electric field emitters for displays, filaments or electronics applications. In some embodiments, such arrays are used as coatings to reduce aerothermal loads. In some embodiments, such arrays are used as adhesives or components of adhesive tapes.

Figure 1A:
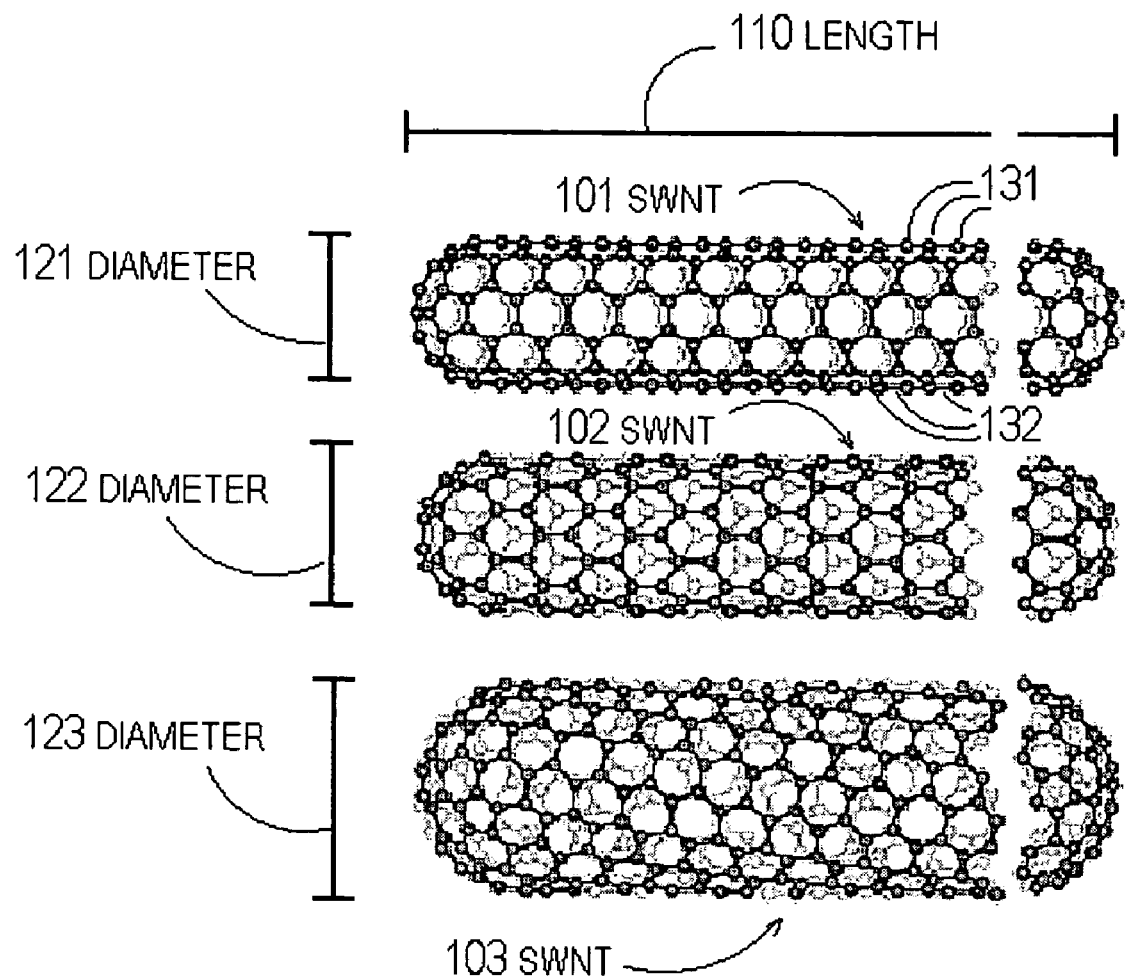
FIG. 1A is a block diagram illustrating molecular structure of single walled carbon nanotubes (SWNTs)

FIG. 1A is a block diagram illustrating molecular structure of single walled carbon nanotubes (SWNT). Three SWNTs 101, 102, 103 are displayed, each with a different diameter, diameter 121, 122, 123, respectively. Each displayed SWNT 101, 102, 103 has a length 110 which can vary from a distance on the same order as the diameter to a very large distance thousands of times the size of the diameter. The variable length is indicated in FIG. 1A by a break in the depiction of each SWNT 101, 102, 103 and the length 110. Each SWNT is made of an arrangement of carbon atoms 131 that make three bonds 132 with three neighboring carbon atoms. The three bonds are typically two single bonds and one double bond. Both ends of each depicted SWNT are capped with a hemisphere of carbon atoms. In some embodiments, one or both ends are open and not capped with a carbon hemisphere. A double bond at a hemispherical cap is most prone to be replaced by a single bond within the SWNT and a bond to another atom or molecule (such as a metal or a hydrocarbon molecule).

Figure 1B:
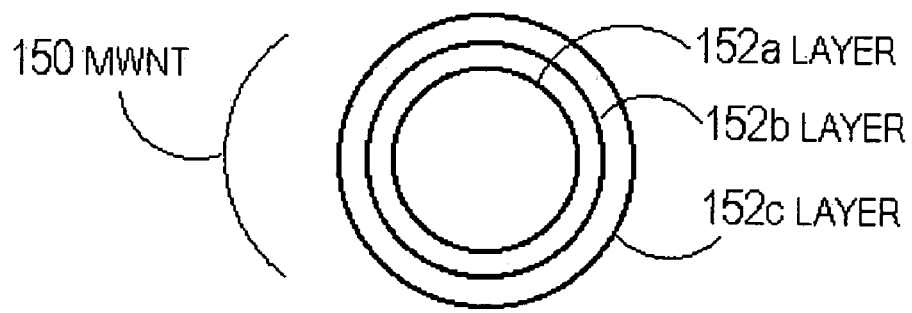
FIG. 1B is a block diagram illustrating a multiple walled carbon nanotube (MWNT)

FIG. 1B is a block diagram illustrating a multiple walled carbon nanotube 150 (MWNT) in cross section. MWNTs are like concentric "onion shells" of SWNTs. MWNT 150 includes three walls corresponding to three layers 152a, 152b, 152c, collectively referenced as layers 152. Each layer 152 is a SWNT. Layer 152a is a SWNT that has the smallest diameter and shortest length; layer 152b is a SWNT that has an intermediate diameter and length; and layer 152c is a SWNT that has the largest diameter and longest length. Other MWNTs have more or fewer layers of SWNTs.

Carbon nanotubes can be grown in a furnace by chemical vapor deposition in the presence of catalyst nanoparticles, which remain effectively bonded to the carbon atoms. The diameters and number of walls of carbon nanotubes produced in a reaction furnace can be controlled during formation based on the size of the catalyst, the temperature of the reaction, and the source type and rate of supply of the carbon-based molecules.

The thermal conductivity along a longitudinal axis of a SWNT or MWNT is higher than the thermal conductivity of diamond (up to about 2000 W/m·K at room temperatures). Thermal conductivity between adjacent walls of a MWNT, or from one carbon nanotube to an adjacent nanotube, is smaller and approaches in a macroscopic sample the thermal conductivity of graphite, about 130 W/m·K.

Figure 2A:
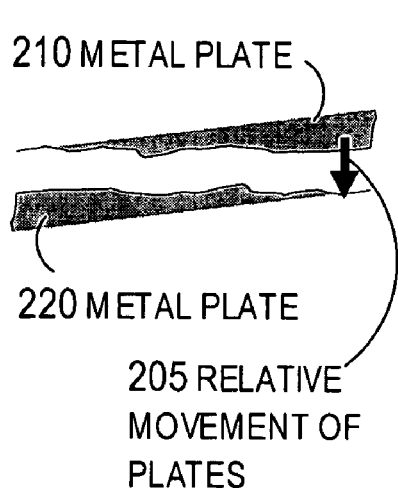
FIG. 2A and FIG. 2B are block diagrams that illustrate a thermal interface between two metal surfaces in two states, a non-contact state and a contact state, respectively.
Figure 2B:
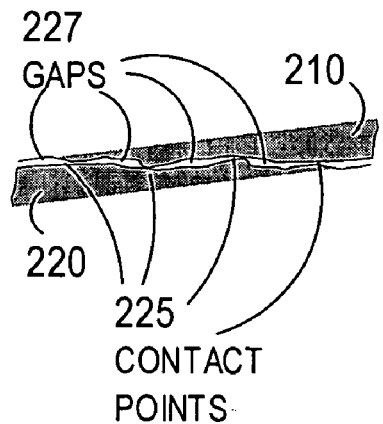

FIG. 2A and FIG. 2B are block diagrams that illustrate a thermal interface between two metal surfaces in two states, a non-contact state and a contact state, respectively. In FIG. 2A two metal surfaces 210, 220 are separated and not in thermal contact. They are moved together in the direction indicated by arrow 205. In FIG. 2B the two metal surfaces 210, 220 are in thermal contact. Because of roughness at the micrometer scale, thermal contact is limited to a few contact points 225 where the surfaces are in contact on a molecular scale. Much of the areas of the surfaces 210, 220 are not in contact but are separated by gaps 227. In air, fluid conduction can transport some heat across the gaps 227. In a vacuum, no heat is transported by conduction in the gaps 227. The thermal interface between surfaces 210, 220 includes the contact points 225 and the gaps 227.

Figure 2C:
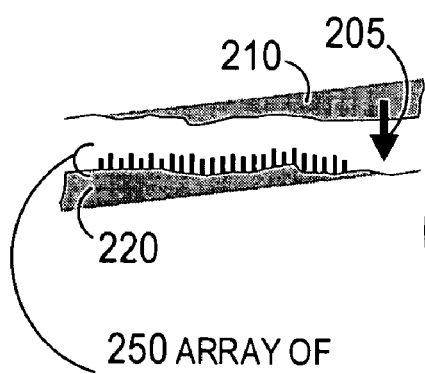
FIG. 2C and FIG. 2D are block diagrams that illustrate an array of aligned carbon nanotubes in a thermal interface between two metal surfaces in two states, a non-contact state and a contact state, respectively, according to an embodiment.
Figure 2D:
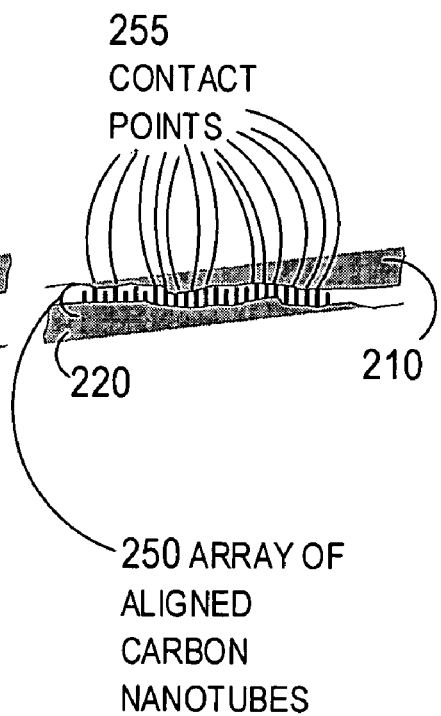

FIG. 2C and FIG. 2D are block diagrams that illustrate an array of aligned carbon nanotubes in a thermal interface between two metal surfaces in two states, a non-contact state and a contact state, respectively, according to an embodiment. In FIG. 2C the two metal surfaces 210, 220 are separated and not in thermal contact. An array of aligned carbon nanotubes 250 are attached to the lower surface 220. In FIG. 2D the two metal surfaces 210, 220 are in thermal contact via the array of nanotubes 250. Because of the array of nanotubes, thermal contact is increased to many contact points 255 between the nanotubes in the array 250 and the upper surface 210. Because the nanotubes in the array 250 are approximately perpendicular to the surface of the metal surface 210, thermal conductivity along the longitudinal axes of the nanotubes should apply. This is much higher than heat conductivity in metal (copper, for example, has a heat conductivity of 400 W/m·K). Therefore the heat transported at each contact point 255 can be greater than the heat transported at each contact point 225 in the metal to metal contact depicted in FIG. 2B. The thermal interface between surfaces 210, 220 includes the contact points 255, the array of nanotubes 250 and the gaps.

The more carbon nanotubes that can be packed into an area of the surfaces 210, 220, the greater the thermal conductivity of the thermal interface. The number of nanotubes per unit area is determined both by the packing ratio and the average diameter of the nanotubes. The packing ratio gives the ratio of the cross sectional area of the nanotubes to the area of the surface covered by nanotubes. The difference between the packing ratio and 100% gives the percentage of gaps in the interface. Therefore the larger the packing ratio the smaller the gap area. However, if the nanotubes are all wide diameter, there are fewer contact points for the same packing ratio than if the nanotubes have smaller diameters. Therefore a combination of a high packing ratio and a small average diameter nanotube is desirable.

An advantage of using an array 250 of carbon nanotubes is that the carbon nanotubes can bend or compress without breaking. Thus the two surfaces 210, 220 can be brought together under pressure, so that nanotubes under protuberances on the surfaces 210, 220 would compress or bend somewhat, allowing the surfaces 210, 220 to be brought closer together. Bringing the surfaces 210, 220 closer together decreases the distance between the surfaces in gaps, and allows more nanotubes in the gaps to also make contact. This increases the number of contacting nanotubes per unit area and proportionately increases the thermal conductivity of the interface.

Another advantage of using an array 250 of carbon nanotubes is that the nanotubes are not sticky, like thermal grease; therefore thermal contact can more easily be ended when desired with nanotubes than with thermal grease compounds.

Therefore, there is a need for arrays of aligned carbon nanotubes with higher packing ratios or smaller diameters or more parallel alignment, or some combination of these properties, than extant arrays of nanotubes; and there is also a need for the methods to form such arrays, and for thermal interfaces and thermal switches using such arrays.

1. Measured Thermal Transport

The thermal transport afforded by arrays of aligned, densely packed carbon nanotubes is demonstrated in this section. Material properties of thermal transport can be expressed by several related parameters, including thermal conductivity, thermal conductance and thermal resistance, all well known in the art. The relationship among these parameters is described for a sample material with cross sectional area A enclosed by two highly conductive materials. One highly conductive material is held at a constant temperature $T_0$; and the other is heated with a constant power $P_0$.

In equilibrium and assuming uniform heat flow over the entire sample area A, Fourier's equation of heat conduction is given by Equation 1.

$$P_0 = A(T_1 - T_0)\kappa/d \qquad (1)$$

Where $T_1$ is the equilibrium temperature reached by the heated conductor, $\kappa$ is the thermal conductivity of the sample material and d is the thickness of the sample material. The units of $\kappa$ are power per length per degree of temperature change, e.g., Watts per meter per Kelvin (W/m·K). For a known thickness d, Equation 1 allows the thermal conductivity $\kappa$ to be determined from the temperature difference between the two thermal conductors, the power $P_0$ and the cross sectional area A. For a more common case, where the conduction process or the thickness is not well defined, such as at a thermal interface with gaps, the thermal conductance K or the thermal resistance R is used, defined as reciprocals of each other by Equations 2 and 3, respectively.

$$P_0 = A(T_1 - T_0)K \qquad (2)$$

$$P_0 = A(T_1 - T_0)/R \qquad (3)$$

For a homogeneous material K and R can be calculated from K and d as given by Equations 4 and 5, respectively.

$$K = \kappa/d \qquad (4)$$

$$R = d/\kappa \qquad (5)$$

The units of K are power per length per degree of temperature change per length, e.g., Watts per Kelvin per square meter (W/K·m²) or Watts per Kelvin per square centimeter (W/K·cm²). The units of R are square length times degree of temperature change per power, e.g., Kelvin times square meters per Watt (K·m²/W) or degrees Celsius times square centimeters per Watt (° C.·cm²/W).

For a layered material, Equations 4 and 5 can not readily be used, but Equations 2 or 3 may be. An advantage of Equation 3 for layered materials is that the thermal resistance R values add linearly, and the temperature difference is just given by the power per unit area and the sum of the R values.

For carbon nanotubes bound to one conductor as a thermal interface that is brought into contact with the other conductor, the thermal resistance of the carbon nanotube interface, $R_{TI}$ can be estimated. It is assumed for purposes of illustration that there is no thermal resistance between the carbon nanotubes and the conductor to which they are bound. Then $R_{TI}$ is given by Equation 6a $$R_{TI}=(R_{CP}+L_{NT}/\kappa_{NT})/(n \cdot A_{NT}) \quad (6a)$$

where $R_{CP}$ is the thermal resistance at a contact point between a carbon nanotube and the second conductor, $L_{NT}$ is the length of the carbon nanotubes, $\kappa_{NT}$ is the thermal conductivity of the carbon nanotubes, $A_{NT}$ is the carbon nanotube cross-sectional area, and n is the number of carbon nanotubes per unit area. Because $\kappa_{NT}$ is very large, the ratio $L_{NT}/\kappa_{NT}$ is negligible compared to $R_{CP}$ and Equation 6a reduces to Equation 6b.

$$R_{TI} \approx (R_{CP})/(n \cdot A_{NT}) \quad (6b)$$

Figure 3:
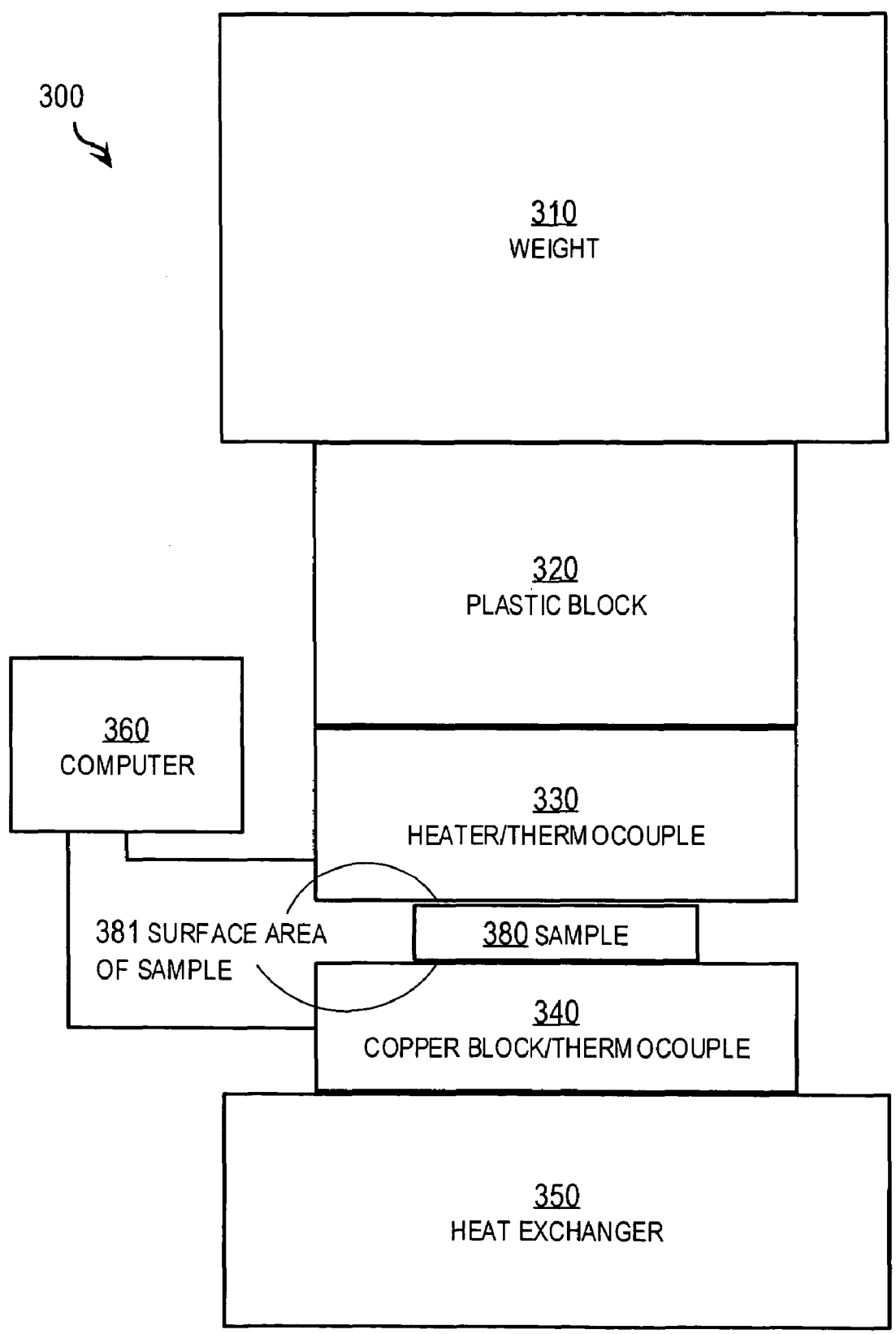
FIG. 3 is a block diagram that illustrates test apparatus for determining thermal conductivity across a thermal interface.

FIG. 3 is a block diagram that illustrates test apparatus 300 for determining thermal transport across a thermal interface. The test apparatus 300 includes a heater/thermocouple 330, a copper block/thermocouple 340, a computer 360, a heat exchanger 350, a weight 310 and a plastic block 320. A sample 380 is placed in the apparatus 300 in thermal contact over its surface area 381 with the heater/thermocouple 330 and copper block/thermocouple 340.

The heater/thermocouple 330 is a copper block with embedded heater and temperature sensor. The heater in the heater/thermocouple 330 provides heat at the constant power $P_0$ used in Equations 1, 2 and 3, above. The temperature sensor is a thermocouple that reports the temperature $T_1$ in contact with the sample 380 and used in Equations 1, 2 and 3, above.

The copper block/thermocouple 340 is a copper block with a temperature sensor. The temperature sensor is a thermocouple that reports the temperature $T_0$ in contact with the sample 380 and used in Equations 1, 2 and 3, above.

The computer 360 receives the signals from the temperature sensors in the heater/thermocouple 330 and copper block/thermocouple 340, and determines values for one or more parameters of heat transport using Equations 1, 2 and 3, above.

The heat exchanger 350 extracts heat from the copper block/thermocouple 340 to maintain a near constant value for $T_0$.

The plastic block 320 provides high heat flow resistance to prevent significant heat flux through the upper surface of the heater/thermocouple 330 and into weight 310.

Weight 310 is a calibrated weight to provide a controlled pressure between the sample 380 and the apparatus 300. The weight 310 may be changed to increase or decrease the pressure between the apparatus and the sample 380. Increasing the pressure can improve thermal contact and increase the heat transport for many kinds of thermal interface.

Apparatus 300 is used to determine values for the parameters of heat transport for various samples. In an illustrated set of measurements, the copper blocks of 330, 340 are optically flat polished copper mirrors. Measurements are performed in a vacuum of pressure $1.5 \times 10^{-5}$ torr ($2 \times 10^{-3}$ Pascals, Pa). The apparatus is covered with metal-coated Mylar to reduce radiation losses. The reference temperature $T_0$ was kept at 37° C., and the heating power $P_0$ was 1 W. Temperature difference data were obtained after about 6 hours, when the temperatures had reached equilibrium.

Thermal resistance R and conductance K were calculated based on the assumption of uniform heat flow over the entire sample area 381. The heat loss through the plastic block 320 was estimated using Equation 1 with a temperature difference given by the difference between room temperature and the maximum measured temperature and the thermal conductivity of the plastic and the thickness of the plastic. The value of the heat loss through the plastic was estimated to be about 4 milliwatts (mW, 1 mW=$10^{-3}$ W). A heat loss of 4 mW is negligibly small compared to the heating power $P_0$ of 1 W when computing parameters of heat transport through the sample 380.

2. Pressure Pretreatment

According to some embodiments, the thermal transport of a thermal interface with carbon nanotubes is increased by pre-treating the thermal interface under high pressure. To demonstrate the effect of high pressure pretreatment, a commercially available array of aligned carbon nanotubes are used as the sample and subjected to the pre-treatment.

In an illustrated embodiment, a sample of carbon nanotubes was purchased from Nanolab, Inc. (of Newman, Mass.), which were fabricated using Ren's method. See Z. F. Ren, A. P. Huang, J. W. Xu, J. H. Wang, P. Bush, M. P. Siegal, and P. N. Provencio, "Synthesis of Large Arrays of Well-aligned Carbon Nanotubes on Glass," *Science*, vol. 282, p. 1105, 1998, the entire contents of which are hereby incorporated by reference as if fully set forth herein. The carbon nanotubes produced by Ren's method are MWNTs grown by plasma-enhanced chemical vapor deposition using nickel catalyst; and were produced in different lengths.

Figure 4A:
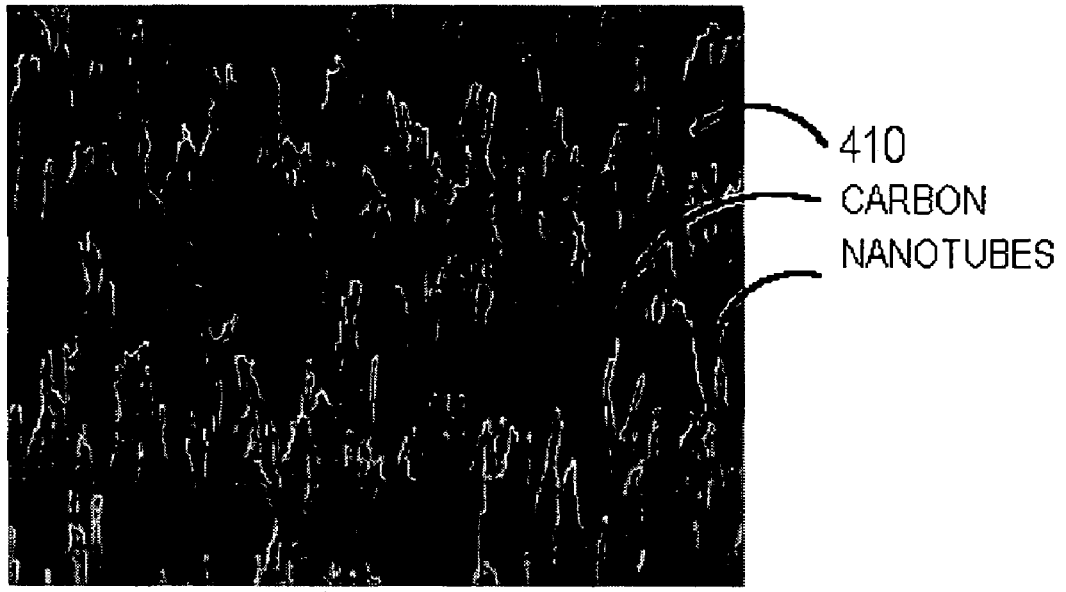
FIG. 4A is an image that illustrates aligned carbon nanotubes in a thermal interface before pretreatment, according to an embodiment.

FIG. 4A is an image that illustrates aligned carbon nanotubes in a thermal interface before pretreatment. The image of FIG. 4A is produced using scanning electron microscopy (SEM) of one of the samples obtained from Nanolab, Inc. The image shows aligned multi-walled carbon nanotubes 410 having diameters of about 120 nm, lengths of about 10 μm; and a density of about 1 μm$^{-2}$.

Figure 4B:
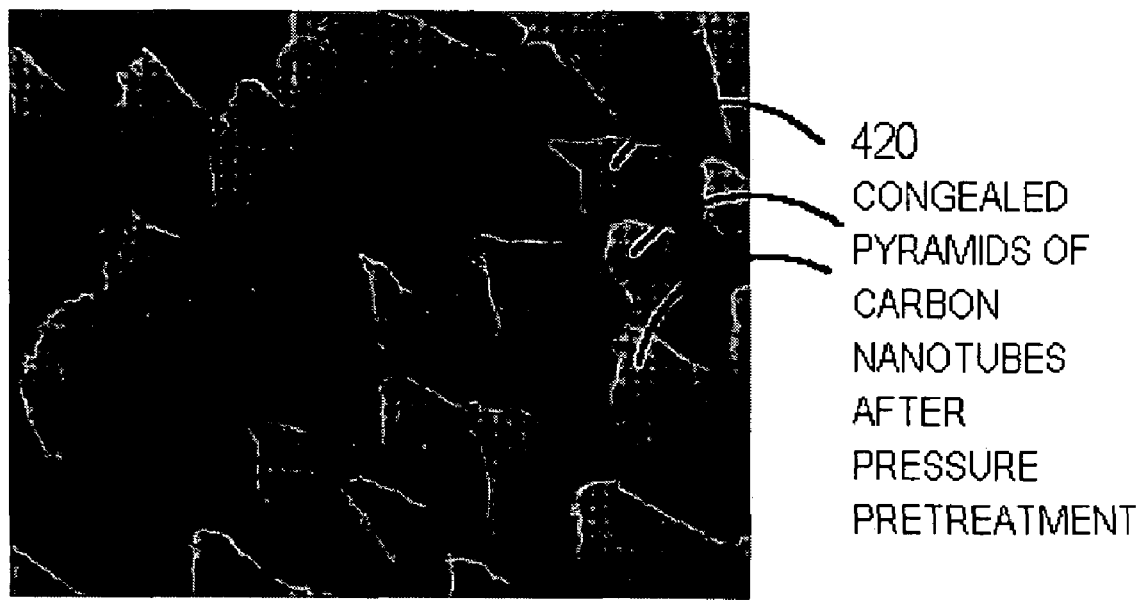
FIG. 4B is an image that illustrates aligned carbon nanotubes in a thermal interface after pretreatment, according to an embodiment.

FIG. 4B is an image that illustrates aligned carbon nanotubes in a thermal interface after pretreatment, according to an embodiment. After being subjected to relatively large pressure (8.72 pounds per square inch), the individual nanotubes evident in FIG. 4A have congealed into multiple pyramids.

Figure 4C:
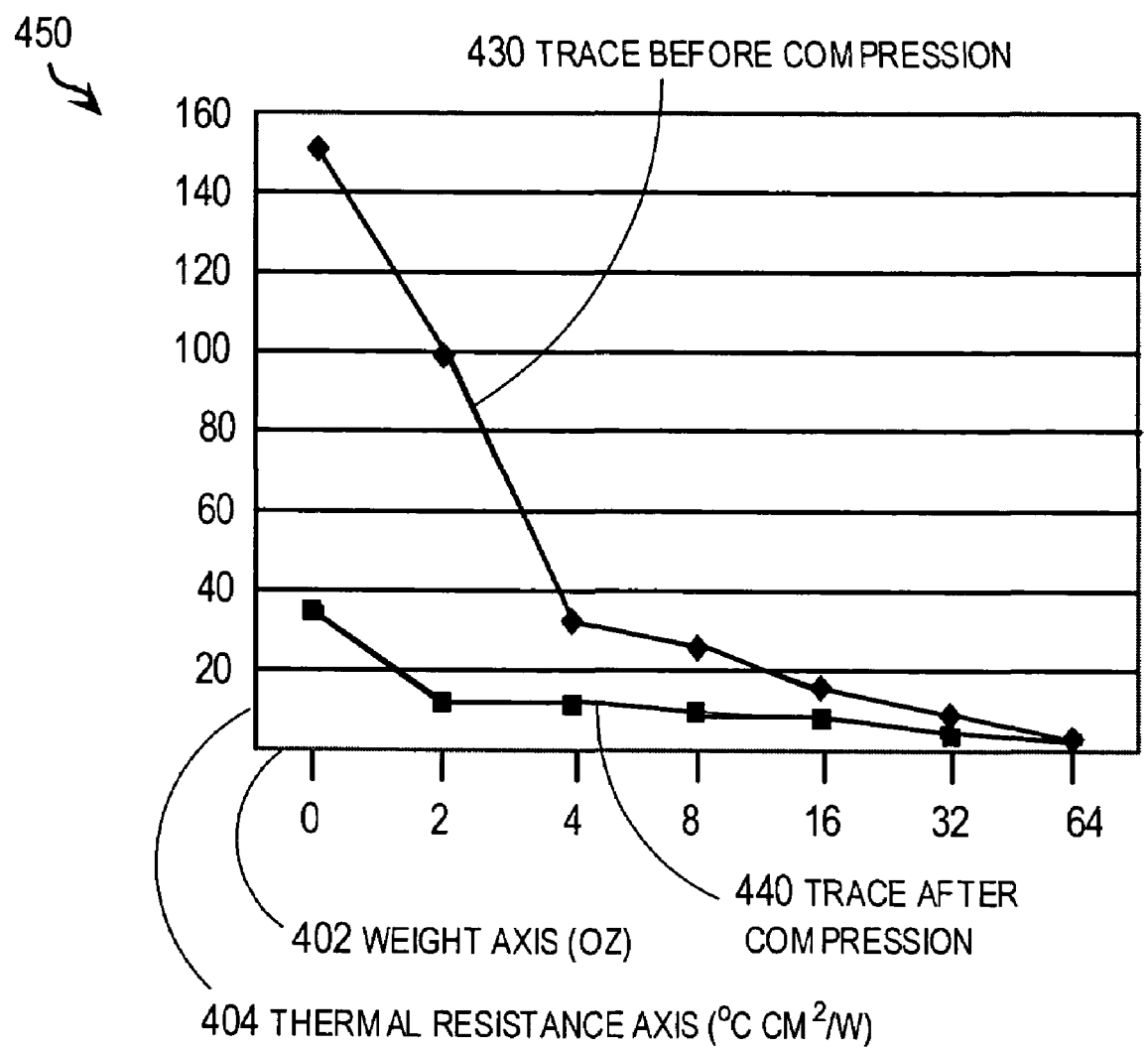
FIG. 4C is a graph that illustrates effects of pretreatment on the thermal conductance of a thermal interface, according to an embodiment.

FIG. 4C is a graph that illustrates effects of pretreatment on the thermal transport of a thermal interface, according to an embodiment. The horizontal weight axis 402 indicates the weight in ounces of the weight 310 depicted in FIG. 3 that presses the copper blocks of 330, 340 against the sample 380. The sample area is about 4 square centimeters (about one square inch), and the pressure is determined by the weight and the sample area. The vertical thermal resistance axis 404 indicates the thermal resistance R in ° C. cm$^2$/W.

Trace 430 shows the dependence of thermal resistance on weight of weight 310 applied in apparatus 300 before the sample is compressed. Before the sample is compressed, thermal resistance is high, about 150° C. cm$^2$/W, when no weight is used in the apparatus 300. As weight is increased, thermal resistance decreases, indicating increased thermal transport. The maximum weight applied is 64 ounces. As shown in FIG. 4C, thermal resistance R remains high (about 100° C. cm$^2$/W) with a two ounce weight before further compression.

Trace 440 shows the dependence of thermal resistance on weight of weight 310 applied in apparatus 300 after the sample is compressed. After the sample is compressed, thermal resistance is low, less than 40° C. cm$^2$/W, even when no weight is used in the apparatus 300, and decreases only slightly as weight is increased. Above a weight of about two ounces, there is relatively little change in thermal transport with weight.

Figure 5:
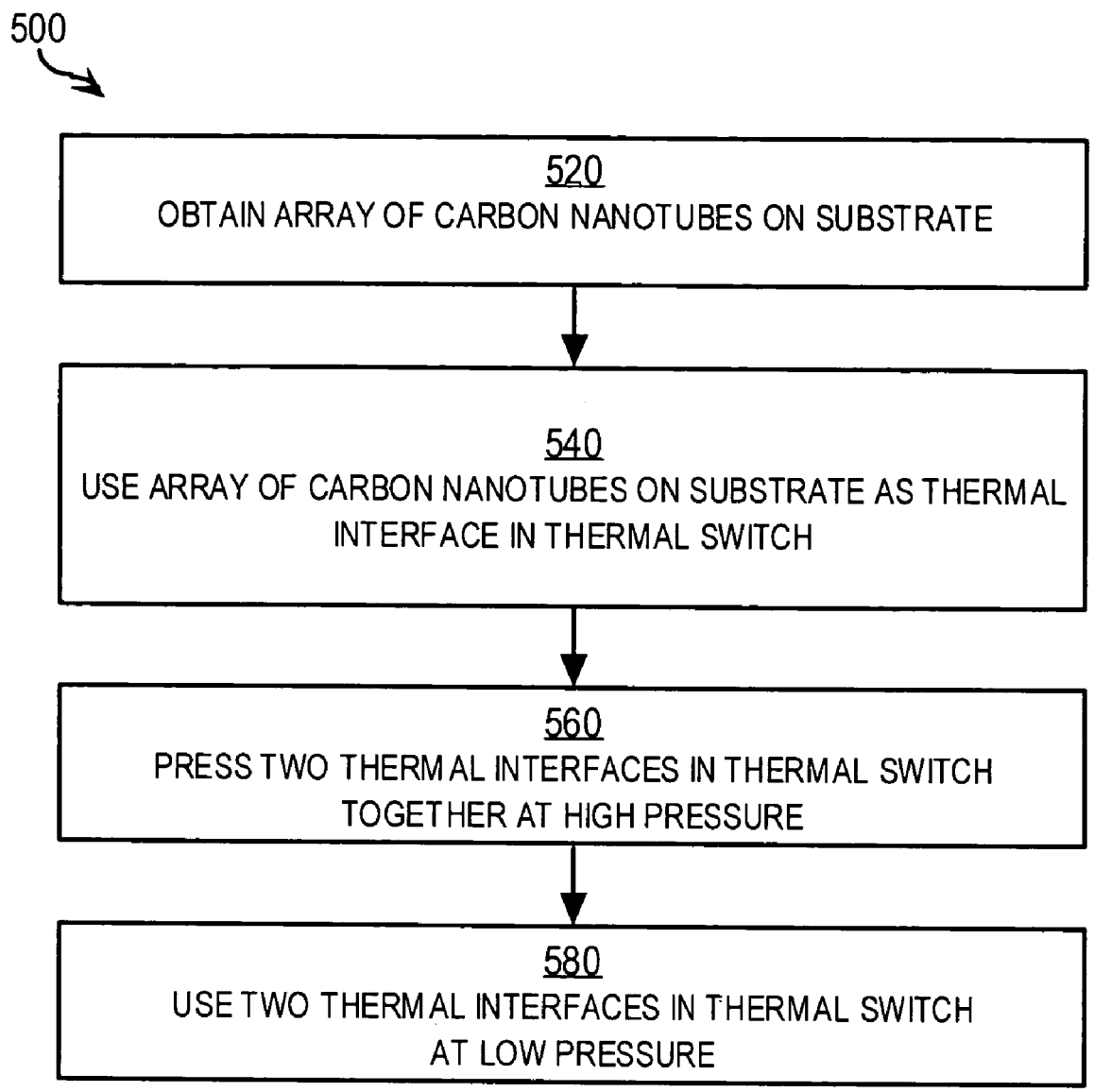
FIG. 5 is a flow chart that illustrates a method for forming a thermal switch, according to an embodiment.

FIG. 4C suggests that after a thermal interface has been subjected to a pretreatment weight of about 64 oz/cm$^{-2}$, good thermal contact (low thermal resistance R) is obtained with operative pressures as little as 2 oz/cm$^{-2}$. Thus after pretreatment at high pressure, the thermal switch can be operated at a much lower operative pressure. Before pretreatment, an operative pressure of 2 oz/cm$^{-2}$ suffers a high thermal resistance R of 100° C. cm$^2$/W. After pretreatment, an operative pressure of 2 oz/cm$^{-2}$ enjoys a much lower thermal resistance R on the order of 10° C. cm$^2$/W FIG. 5 is a flow chart that illustrates a method 500 for forming a thermal switch, according to an embodiment. In step 520 an array of carbon nanotubes on a substrate is obtained. For example, commercial arrays of aligned carbon nanotubes on a substrate may be purchased. In other embodiment, arrays of aligned carbon nanotubes are formed using one or more methods described in more detail in later sections.

In step 540, the array of carbon nanotubes on the substrate is used as a thermal interface in a thermal switch. For example, the substrate is attached to metal surface 220 in FIG. 2A to form the thermal interface 220, 250 in FIG. 2C, or the substrate with nanotubes is used instead of metal surface 220 with nanotubes 250 in FIG. 2C.

In step 560, two thermal interfaces are pressed together at a high pressure called a pretreatment pressure. For example, metal surfaces 210, 220 in FIG. 2C are brought together as indicated by arrow 205 under a pretreatment pressure of about eight pounds per square inch. Under this pretreatment pressure, the array of nanotubes conform to the gaps between the surfaces, such as gaps 227 in FIG. 2B, to form compressed nanotube-based structures, such as the congealed pyramids depicted in FIG. 4B.

In step 580, the thermal interfaces are used repeatedly in the thermal switch at an operative pressure that is lower than the pretreatment pressure. For example, the thermal interfaces repeatedly are alternately separated and brought together at low pressure (about four ounces per square inch or less), as illustrated in FIG. 2C and FIG. 2D.

3. Room Temperature Assembly

FIG. 6 is a flow chart that illustrates a method 600 for forming aligned carbon nanotubes, according to an embodiment. The method 600 can be performed at temperatures much lower than in a chemical vapor deposition furnace, and is called herein a room temperature method to assemble arrays of carbon nanotubes. Although steps are show in FIG. 6 is a particular order, in other embodiments, some steps may be performed in a different order or overlapping in time or omitted. For example, steps 630 and 644 overlap in time in some embodiments; and step 642 precedes step 610 in some embodiments.

In step 610, carbon nanotubes already formed are obtained. For example, samples of carbon nanotubes are purchased as "Buckypearls" from Carbon Nanotechnologies, Inc. of Houston, Tex. These Buckypearls appear macroscopically to be small, mostly round, black balls with the color and texture of soot. Commercial samples often include impurities such as residual metal catalysts and amorphous carbon side products. Commercial samples often also include a wide range of carbon nanotubes with different lengths and diameters. Also many nanotubes in commercial samples are aggregated in clusters of nanotubes.

In step 620, the sample is purified. Purification involves removing impurities, or separating nanotubes of a particular diameter range or length range, or separating nanotubes from clusters, or some combination of these processes. Any method known in the art may be used to purify these samples. See for example Jie Liu, Andrew G. Rinzler, Hongjie Dai, Jason H. Hafner, R. Kelley Bradley, Peter J, Boul, Adrian Lu, Terry Iverson, Konstantin Shelimov, Chad B. Huffman, Fernando Rodriguez-Macias, Young-Seok Shon, T. Randall Lee, Daniel T. Colbert and Richard E. Smalley, "Fullerene Pipes," *Science*, vol. 280, p 1253, 1998, the entire contents of which are hereby incorporated by reference as if fully set forth herein.

In an example purification process, 0.2 milligrams (mg, 1 mg=10$^{-3}$ grams) of carbon nanotubes are reacted with 5 Molar (M) nitric acid at 120 degrees Celsius (° C.) for one hour. When a tube is purified in nitric acid, the environment oxidizes an open end of the tube from a carbon-carbon bond to a carboxylic acid. The reactant is allowed to cool, is filtered, is washed extensively with distilled water, and is then allowed to dry overnight under vacuum. Next, 0.1 mg of the acid cleaned nanotubes is reacted with 0.5 grams (g) of octadecylamine in a melt at 90° C. for four days. The resulting tar-like substance is sonicated in ethanol, dried, and then sonicated extensively in toluene. Most of the tar dissolved in toluene and the residual sediment is filtered off. The remaining nanotubes are accelerated in a Thermo IEC MultiRF centrifuge at speeds from 1,000 rotations per minute (rpm) to 13,000 rpm for up to an hour to separate aggregated clusters from single nanotubes and also to crudely separate tubes by length.

The nanotubes can be characterized (e.g., by diameter, length or purity) at any stage by transmission electron microscopy (TEM) using, for example, a Phillips 420T microscope with LaB6 filament (available from FEI Company, Hillsboro, Oreg.), operating at 120 kiloVolts (kV, 1 kV=10$^3$ Volts) accelerating voltage. The nanotubes also can be characterized by Raman spectroscopy using, for example, a HoloSpec VPT optical microscope/Raman system (available from Kaiser Optical Systems, Ann Arbor, Mich.), with an excitation wavelength of 785 nanometers (nm). Digital photography and visual inspection may also be used to monitor rough solubility changes. Atomic force microscopy (AFM) can also be used to characterize nanotube length using, for example, a Digital Instruments MultiMode AFM (available from Veeco, formerly Digital Instruments, Santa Barbara, Calif.).

In some embodiments step 620 is omitted. For example, in embodiments with samples that include few impurities or a narrow range of lengths and diameters or minimal aggregate clustering, or some combination, step 620 is omitted.

In step 630, the carbon nanotubes are arranged into a dense array of near uniform spacing using a Langmuir-Blodgett trough. The use of a Langmuir-Blodgett trough to arrange microscopic particles is well known in the art. See for example Qijie Guo, Xiaowei Teng, Saifur Rahman and Hong Yang, "Patterned Langmuir-Blodgett Films of Monodisperse Nanoparticles of Iron Oxide Using Soft Lithography," Journal of the American Chemical Society, vol. 125, p630, 2003, the entire contents of which are hereby incorporated by reference as if fully set forth herein. The use of a Langmuir-Blodgett trough for arranging carbon nanotubes, is described by Nathan R. Franklin and Hongjie Dai, "An Enhanced CVD Approach to Extensive Nanotube Networks with Directionality," Advanced Materials, vol 12, p 890, 2000.

Figure 7A:
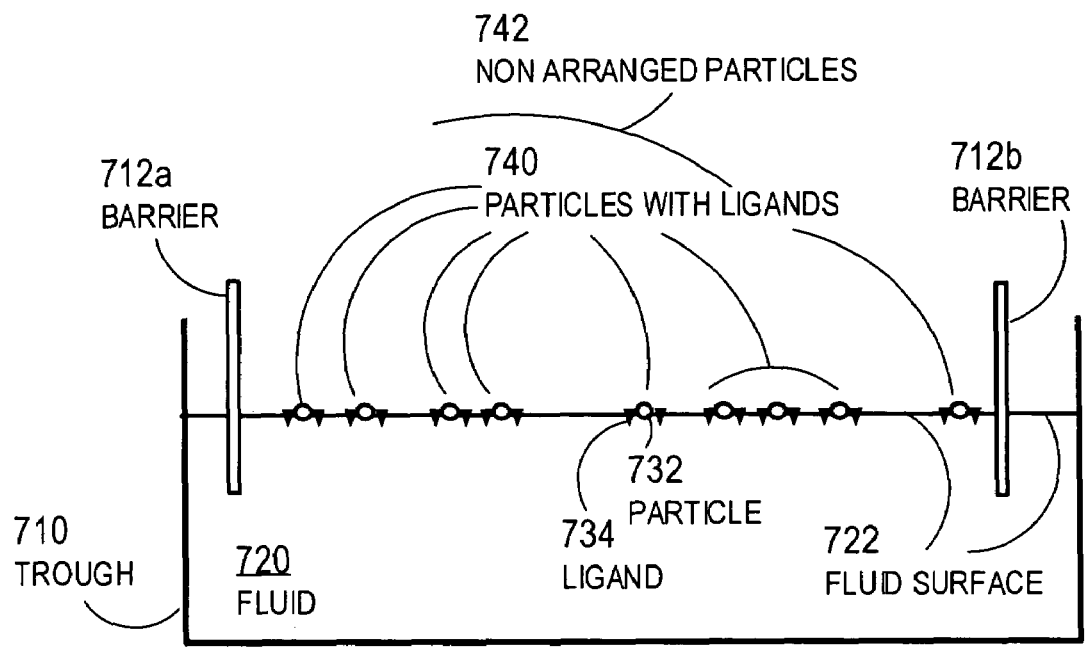
FIG. 7A is a block diagram that illustrates a Langmuir-Blodgett trough before barriers converge.

FIG. 7A is a block diagram that illustrates a Langmuir-Blodgett trough before barriers converge. A Langmuir-Blodgett trough includes a trough 710 for holding a fluid 720 and at least one moveable fluid barrier. In FIG. 7A, two moveable fluid barriers 712a, 712b are included. The fluid barriers 712a, 712b are positioned to intersect the surface 722 of the fluid 720. Particles 732 to be arranged are bound to ligands 734 to form particles with ligands 740 that are added to the surface 722 of the fluid 720 between the barriers 712a, 712b. The particles 732 are represented as circles in FIG. 7A and FIG. 7B for illustration purposes; but in practice the particles are much smaller and more numerous than the particles 732 depicted, and are often not visible on the scale of the trough 710. Ligands 732 are bound to the particles 732 to determine the spacing of the particles when the particles are densely packed. Ligand molecules 734 are represented as triangles in FIG. 7A and FIG. 7B for illustration purposes; but in practice the molecules are much smaller and more numerous than the molecules 730 depicted, and are often not visible on the scale of the trough 710. Ligands that can be used include but are not limited to oleic acid, octanoic acid, and lauric acid.

When first added, the particles with ligands 740 form a collection 742 of non-arranged particles. The particles with ligands 740 stay on the surface 722 of the fluid 720 due to insolubility in the fluid phase of the particles with ligands 740 or due to the surface tension of the fluid compared to the displacement weight of the particles with ligands 740.

Figure 7B:
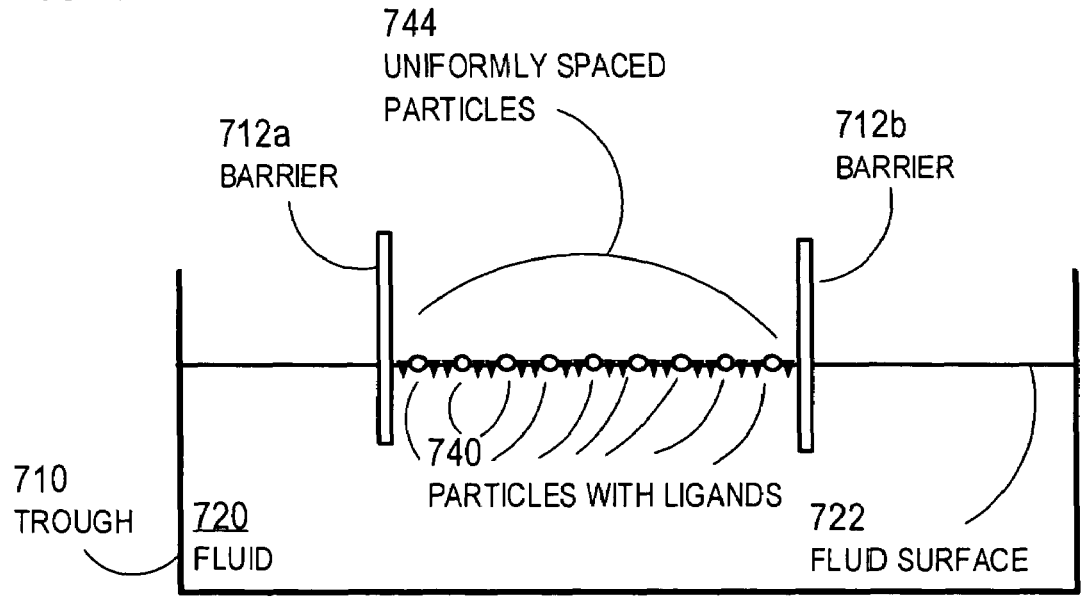
FIG. 7B is a block diagram that illustrates a Langmuir-Blodgett trough after barriers converge.
Figure 7C:
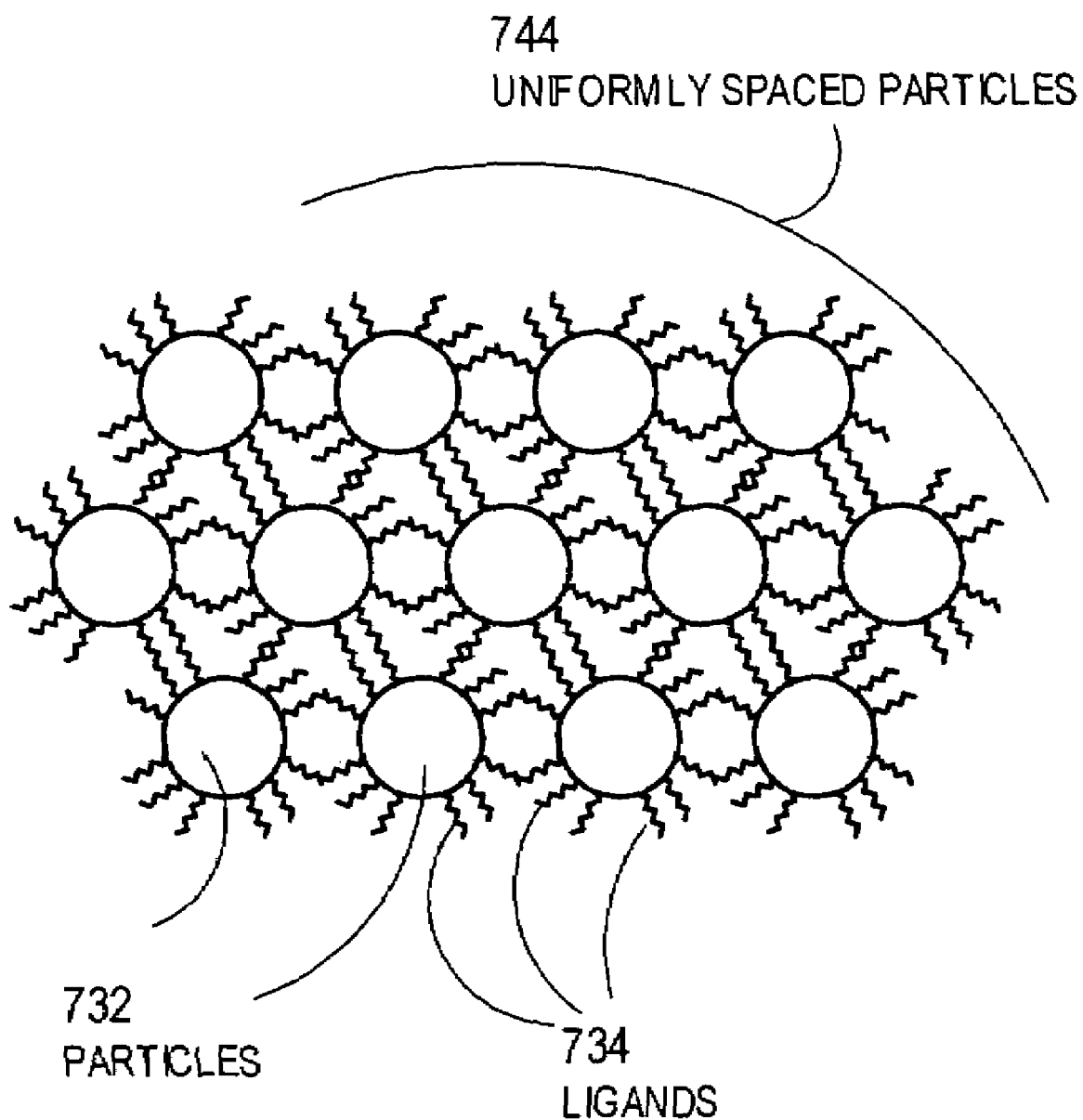
FIG. 7C is a block diagram that illustrates arranged particles on a fluid surface of the Langmuir-Blodgett trough after barriers converge.

FIG. 7B is a block diagram that illustrates a Langmuir-Blodgett trough after barriers 712a, 712b converge. As the barriers converge, the trough surface compression and ligand molecules 734 control the minimum separation between particles 732. By controlling the size of the ligand molecules, the ratio of the number of ligand molecules 734 to the number of particles 732, and the separation of the barriers 712a, 712b, a near uniform, dense packing of the particles 732 can be achieved. A near uniformly spaced, densely packed arrangement 744 of particles 732 is shown on the surface 722 of the fluid 720 in FIG. 7B. FIG. 7C is a block diagram that illustrates arranged particles 744 on a fluid surface of the Langmuir-Blodgett trough after barriers converge, as viewed from above. As can be seen in FIG. 7C, the ligands 734 attached to the particles 732 effect the uniform two dimensional spacing of the particles 732.

In step 630, the ligand, fluid, nanotube size range, ligand concentration and nanotube concentration are selected to form a near uniform, densely packed arrangement of nanotubes. In some embodiments, the nanotubes align in parallel horizontal rows a few nanometers apart; in some embodiments, each nanotube is bound to and dangles vertically from a molecule that is held on the fluid surface 722 to form a two dimensional array of perpendicularly oriented nanotubes a few nanometers apart. In some embodiments, step 630 is omitted.

In step 640, the arranged nanotubes from step 630 (or the unarranged purified nanotubes from step 620, or the unarranged and unpurified nanotubes of step 610) are condensed onto a substrate. Any method for condensing nanotubes onto a substrate may be used. See for example Nathan R. Franklin and Hongjie Dai, "An Enhanced CVD Approach to Extensive Nanotube Networks with Directionality," *Advanced Materials*, vol. 12, p 890, 2000, the entire contents of which are hereby incorporated by reference as if fully set forth herein.

In an illustrated embodiment, step 640 includes novel steps 642, 644, 646. FIG. 8A and FIG. 8B are block diagrams that illustrate chemical attachment of carbon nanotubes to a gold substrate, according to an embodiment of step 640.

In step 642 an amine monolayer is formed on a substrate. This process is depicted in FIG. 8A according to an embodiment in which the substrate is gold. Other suitable substrates include silver films, or silicon in which case a silane/amine bifunctional molecule would be used for binding in place of the thiol/amine. Amine molecules 810, represented by the chemical symbol HS—$(CH_2)_6$—$NH_2$, are depicted as short vertical bars. A gold substrate 820 is exposed to the amine molecules 810 as indicated by the plus symbol 815 in FIG. 8A. The reaction is indicated by the arrow 825 and the result is an amine coated gold plate 830. The gold substrate 820 is coated with a monolayer of amine molecules at a spacing determined by the size and concentration of the amine molecules 810.

In step 644, the carbon nanotubes are bound to carboxylic acid. In some embodiments, step 644 is performed before step 642. In some embodiments, step 644 is performed during or before step 630 in which the carbon nanotubes are arranged in the Langmuir-Blodgett trough. In an illustrated embodiment, step 644 is performed during step 620. The purified carbon nanotubes have a hemispherical carbon cap at one end and the dangling bonds where the metal catalyst particle once was have been oxidized to carboxylic acids.

In step 646 the surface of the substrate with the amine monolayer is brought into contact with a solution of carbon nanotubes. In the illustrated embodiment, the surface of the substrate with the amine monolayer is brought into contact with the fluid surface 722 in the Langmuir-Blodgett trough 710 after the barriers 712a, 712b converge. Consequently, the arrangement 744 of near uniformly spaced, densely packed nanotubes are brought into contact with the amine coated substrate, whereby a carboxylic acid on a free, non-bound open end of the carbon nanotube is exchanged for an amine molecule bound to the substrate. In embodiments that omit step 630, the amine coated substrate is dipped in a solution with purified or unpurified nanotubes. This process is depicted in FIG. 8B according to an embodiment in which the substrate is gold. A carbon nanotube 842 has a carboxylic group 844, represented by its chemical symbol COOH, at each open end to form carbon nanotubes with terminal carboxylic acids 840 as a result of step 644, described above. By virtue of step 630, described above, the carboxylic bound carbon nanotubes 840 are nearly uniformly spaced and densely packed. The amine coated gold substrate 830 is exposed to the carbon nanotubes with terminal carboxylic acids 840 as indicated by the plus symbol 845 in FIG. 8B. In the ensuing reaction, indicated by the arrow 855, an amine molecule on the gold substrate reacts with each nanotube's terminal carboxylic acid group in a condensation reaction. The result is an array of carbon nanotubes bound to the gold substrate 850 through the amine molecules. If the spacing of the amine molecules on the gold substrate is less than (as shown) or equal to the spacing of the arranged nanotubes 744, the arrangement of the nanotubes on the gold substrate is approximately determined by the spacing of the arranged nanotubes 744 in the Langmuir-Blodgett trough. If the spacing of the amine molecules on the gold substrate is less than (as shown) or equal to the diameter of unarranged nanotubes, in embodiments in which step 630 is omitted, the arrangement of the nanotubes on the gold substrate is determined by self assembly.

In step 650 the substrate with the condensed nanotubes is used as a thermal interface, such as in a thermal switch or to connect a heat producing mechanical or electrical component to a heat sink. In some embodiments in which the array of aligned carbon nanotubes are used for other purposes, step 650 is omitted.

In step 660, the thermal interface is used in a thermal switch. Use as a thermal interface in a thermal switch is described in more detail in a later section. In some embodiments in which the array of aligned carbon nanotubes are used for other purposes, step 660 is omitted.

In step 670, it is determined whether another nanotube interface is to be produced, for example for a second thermal interface in a switch or for some other purpose, including a non thermal application. If another nanotube interface is to be produced, control returns to step 630 to arrange carbon nanotubes into a near uniformly spaced, densely packed arrangement and repeat step 640, or 650, or 660, or some combination. In some embodiments, step 670 is omitted and control passes directly to step 680.

In step 680, one or more thermal interfaces are pretreated at pressures higher than operating pressures, as described in more detail above. In some embodiments, step 680 is omitted.

4. High Packing Assembly

FIG. 9 is a flow chart that illustrates a method 900 for forming aligned carbon nanotubes, according to another embodiment. The method 900 involves chemical vapor deposition in a furnace; and can lead to an array of highly packed aligned carbon nanotubes of uniform size and spacing. The method 900 is called herein a high packing method to assemble arrays of carbon nanotubes. Although steps are show in FIG. 9 is a particular order, in other embodiments, some steps may be performed in a different order or overlapping in time or omitted. For example, step 920 is omitted in some embodiments; and steps 950, 960, 970 and 980 are omitted in some embodiments.

In step 920, metal catalyst particles are formed with a narrow size distribution using thermolytic decomposition. For example, iron catalyst nanoparticles are prepared from thermolytic decomposition of iron pentacarbonyl as described in C. L. Cheung, A. Kurtz, H. Park and C. M. Lieber, "Diameter-Controlled Synthesis of Carbon Nanotubes," *Journal of Physical Chemistry B*, 106, pp 2429-2433, 2002 (hereinafter Cheung), the entire contents of which are hereby incorporated by reference as if fully set forth herein. Thermolytic decomposition is capable of producing metal catalyst particles much smaller than can be produced by the methods described in Knowles. For example, iron nanoparticles can be produced with a distribution of sizes less than 5 nm; while the cobalt particles described in Knowles have sizes of 10 nm or larger determined by the sizes of pores formed in alumina. In addition, the smaller particles formed by thermolytic decomposition by can be packed more closely together on a substrate, especially by using a Langmuir-Blodgett trough as described in more detail below, than the alumina pores of Knowles. Packing metal catalyst particles more closely allows more densely packed carbon nanotubes to be grown than are suggested in Knowles.

In various and other embodiments, step 920 is replaced with a step that forms iron, nickel or cobalt nanoparticles as catalyst particles, with or without using thermolytic decomposition.

In step 930, catalyst nanoparticles are arranged into a dense array of near uniform spacing using a Langmuir-Blodgett trough. The use of a Langmuir-Blodgett trough to arrange microscopic particles is described above with respect to step 630. In step 930 the particles are catalyst nanoparticles rather than carbon nanotubes. In an illustrated embodiment, the iron catalyst nanoparticles formed in step 920 are arranged into a dense array of near uniform spacing using the Langmuir-Blodgett trough. The spacing of the catalyst nanoparticles is determined by a ligand bound to the catalyst nanoparticles and the horizontal pressure applied to the resulting monolayer using the Langmuir Blodgett trough. In the illustrated embodiment, oleic acid was the ligand bound to the iron catalyst nanoparticles produced in step 920.

In step 934, the catalyst particles on the fluid surface of the Langmuir-Blodgett trough are deposited on a substrate. In an illustrated embodiment, one surface of a silicon plate with a 0.5 μm layer of silicon-oxide is brought into contact with the fluid surface of the Langmuir-Blodgett trough to deposit the near uniform, densely packed array of iron catalyst nanoparticles onto the silicon-oxide substrate.

Figure 10A:
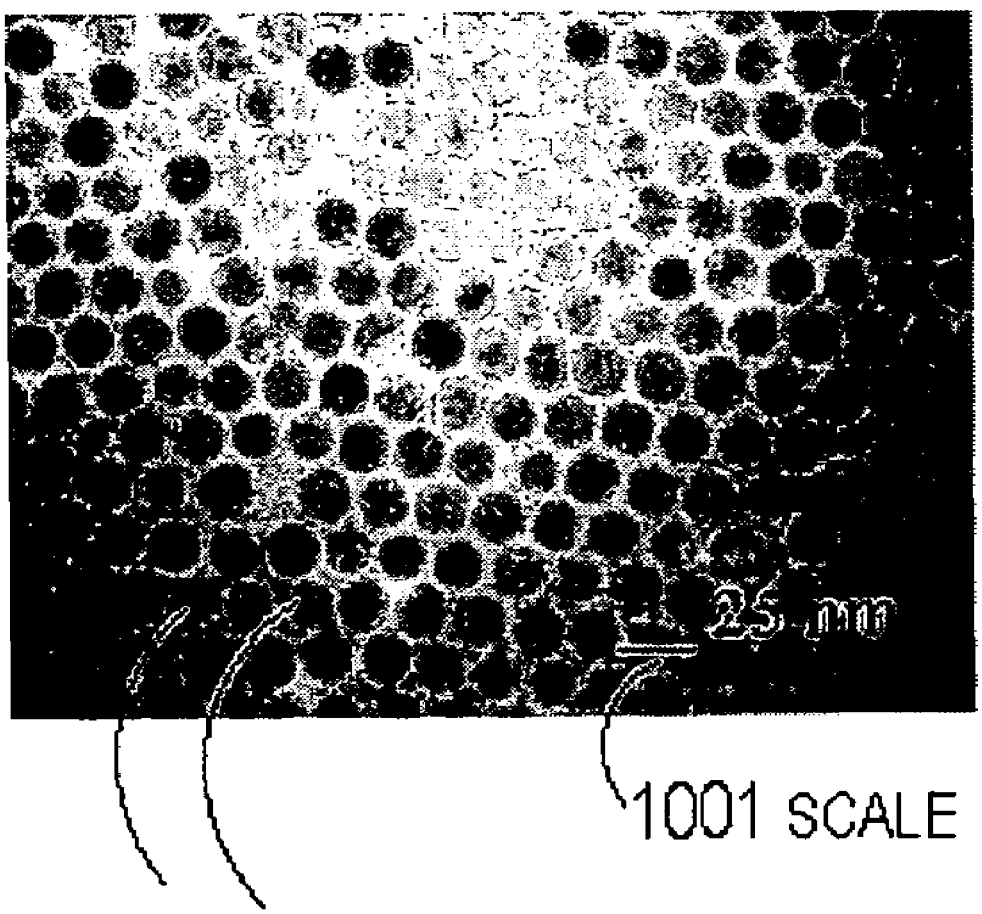
FIG. 10A is an image that illustrates arranged metal catalyst particles on a substrate, according to an embodiment.

FIG. 10A is an image that illustrates arranged metal catalyst particles 1002 on a substrate, according to an illustrated embodiment. The image is formed by transmission electron microscopy (TEM). In FIG. 10A the catalyst particles are iron nanoparticles formed during step 920 and arranged during step 930. As can be seen, the iron nanoparticles are densely packed and near uniform in size and spacing. The size and spacing of the iron nanoparticles in the illustrated embodiment are given by the scale bar 1001, which corresponds to a length of 25 nm. The nanoparticles are about 20 nm in diameter and are separated by about 5 nm, thus achieving a center to center distance of 25 nm in each row, with alternating rows offset, which increases packing ratio. The packing ratio of the illustrated arrangement is about 50%. Nanotubes with diameters greater than the nanoparticles would have outer dimensions that touch and pack even more tightly with correspondingly higher packing ratios. Nanotubes with packing ratios of 60% to 74% can be achieved. In other embodiments, smaller iron particles that are more closely spaced are produced that grow tightly packed nanotubes with smaller diameters.

In step 940, an array of aligned carbon nanotubes is formed by growing carbon nanotubes onto the metal catalyst particles on the substrate using chemical vapor deposition (CVD). The number of walls and length of the carbon nanotubes are affected by the environment, temperature, and duration of the CVD. Any method known in the art for growing nanotubes by CVD may be used. In an illustrated embodiment, the substrate with arranged iron catalyst nanoparticles is inserted into a CVD furnace and exposed to an environment of 80-110 milliLiters (mL, 1 mL=$10^{-3}$ Liters) per minute (min) acetylene mixed with 1000 mL/min argon at a temperature of 730° C. for 1.5 to 2 hours. After cooling to room temperature, the substrate is removed from the furnace. As a result of the CVD process, the substrate is coated with a black, velvet-like layer of aligned carbon nanotubes.

Figure 10B:
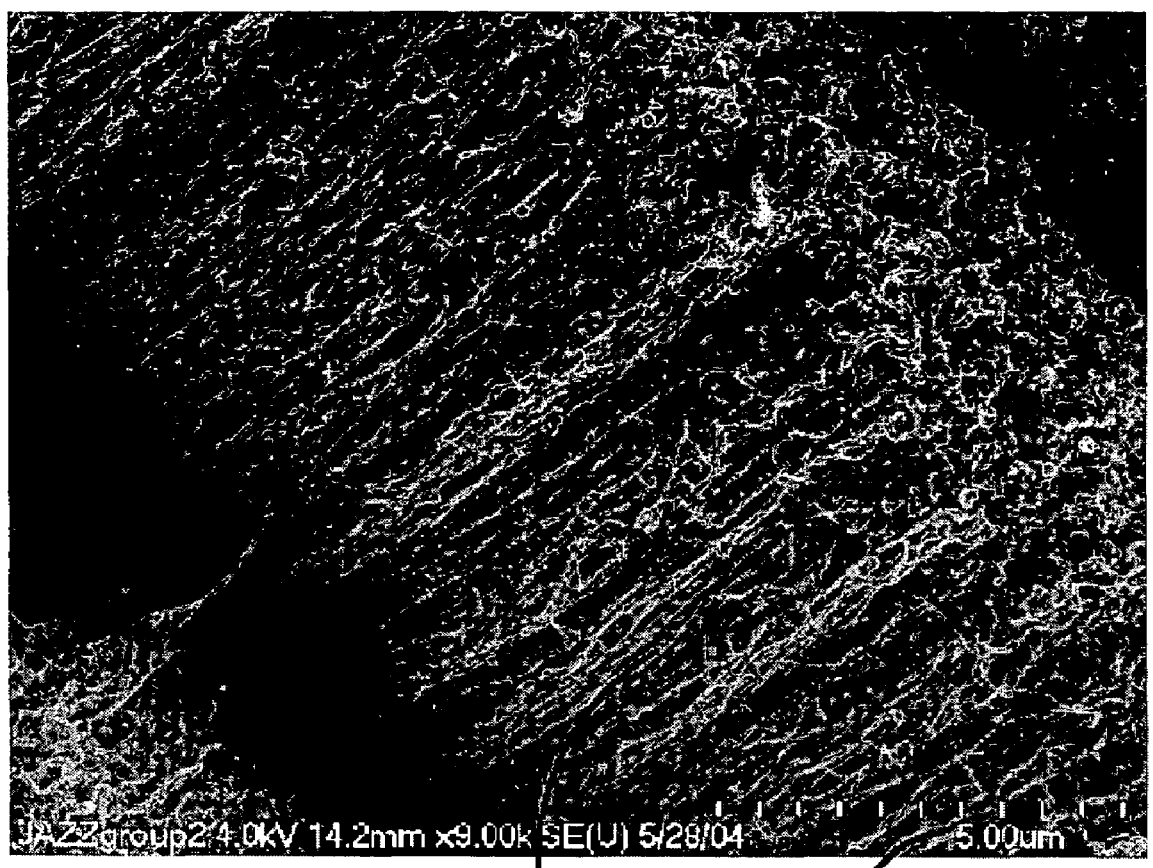
FIG. 10B and FIG. 10C are images that illustrate aligned carbon nanotubes in a thermal interface with a high packing ratio, according to various embodiments.
Figure 10C:

FIG. 10B and FIG. 10C are images that illustrate aligned carbon nanotubes 1010, 1012 in a thermal interface with a high packing ratio, according to various embodiments. The images of FIG. 10B and FIG. 10C are formed by scanning electron microscopy (SEM). As can be seen, the carbon nanotubes 1010, 1012 are thin, aligned, densely packed and near uniform in size and spacing, with some curling due to defects along their lengths and at the exposed tip. The size and spacing of the carbon nanotubes in the illustrated embodiment are given by the scale bars 1011, 1013 which corresponds to lengths of 1.25 μm and 1.11 μm, respectively. These are aligned multi-walled carbon nanotubes (MWNTs) with diameters of about 15 to 50 nm, roughly 8 to 10 μm long, with a density of about 100 per square micron (100 $\mu m^{-2}$) and more—corresponding to packing ratios of about 50% and greater. In other embodiments, smaller carbon nanotubes that are more closely spaced are produced using method 900.

In step 950 the substrate with the aligned nanotubes is used as a thermal interface, such as in a thermal switch or to connect a heat producing mechanical or electrical component to a heat sink. In some embodiments in which the array of aligned carbon nanotubes are used for other purposes, step 950 is omitted.

In step 960, the thermal interface is used in a thermal switch. Use as a thermal interface in a thermal switch is described in more detail in a later section. In some embodiments in which the array of aligned carbon nanotubes are used for other purposes, step 960 is omitted.

In step 970, it is determined whether another nanotube interface is to be produced, for example for a second thermal interface in a switch or for some other purpose, including a non thermal application. If another nanotube interface is to be produced, control returns to step 930 to arrange metal catalysts into a near uniformly spaced, densely packed arrangement and repeat step 934, 940, or 950, or 960, or some combination. In some embodiments, step 970 is omitted and control passes directly to step 980.

In step 980, one or more thermal interfaces are pretreated at pressures higher than operating pressures, as described above. In some embodiments, step 980 is omitted.

5. Example Thermal Interface Performance

Table 1 lists measured thermal transport through different coatings and substrates to form different samples, in order of increasing thermal conductance. Thermal transport through each sample was measured using the test apparatus 300 depicted in FIG. 3, and is expressed as thermal resistance R (in K·cm$^2$/W) and its reciprocal thermal conductance K (in W/K·cm$^2$). The thermal resistance R measured for each sample represents the sum of the thermal resistance R1 from copper block in 330 to sample 380 across an upper interface, thermal resistance R2 through the sample 380, and thermal resistance R3 from the sample 380 to copper block 340 across a lower interface. The value of weight 310 used in apparatus 300 is indicated in the table.

The control sample is a one square centimeter piece of silicon with a 0.5 μm layer of silicon oxide on each side (an uncoated silicon plate). The dense NT sample has densely packed nanotubes formed by method 900 on the upper interface of a silicon plate with a 0.5 μm layer of silicon oxide on each side. These nanotubes have diameters of about 15-50 nm, length about 8 to 10 μm and density greater than about 100 μm$^{-2}$ on the upper interface.

For purposes of comparison, two commercially available carbon nanotubes on metal substrates are included in Table 1: Nanolab A; and Nanolab B. Nanolab A, obtained from Nanolab, Inc, includes large MWNTs of diameter 50 to 80 nm, length 6 μm and density of about 1 μm$^{-2}$ on the upper interface of a Nickel-Chromium-Copper (Ni—Cr—Cu) substrate. Nanolab B, obtained from Nanolab, Inc, includes large MWNTs of diameter 40 to 80 nm, length 6 to 8 μm and density of about 1 μm$^{-2}$ on the upper interface of a Ni—Cr—Cu substrate.

In some samples, thermal grease was used on the upper or lower surface or both. Thermal grease used in these experiments was AS#3 from Arctic Silver Inc. (Visalia, Calif.). AS#3 has a thermal resistance R of about 1 K·cm$^2$/W corresponding to a thermal conductance K of about 1 W/K·cm$^2$.

The results shown in Table 1 indicate that a dense MWNT coating grown according to method 900 on a silicon substrate is more thermally conductive than thermal grease and more thermally conductive than commercially available carbon nanotubes on metal substrates. Thermal grease also outperforms commercially available carbon nanotubes on metal substrates; however, a dense MWNT coating grown according to method 900 is less sticky than thermal grease.

TABLE 1

Relative thermal transport through different samples.

| Sample | Weight(g)/ Area(cm$^2$) | R (K·cm$^2$/W) | K (W/K·cm$^2$) |
|---|---|---|---|
| Control | 0/1.09 | 78 | 0.013 |
| Control | 1515.08/1.09 | 28 | 0.038 |
| Control with AS#3 on lower interface | 1515.08/1.09 | 20 | 0.05 |
| Dense NT on Si | 1515.08/1.09 | 9.2 | 0.11 |
| Nanolab A with AS#3 on lower interface (metal substrate) | 1515.08/2.47 | 3.45 | 0.29 |
| Nanolab B with AS#3 on lower interface (metal substrate) | 1856.12/3.77 | 3.01 | 0.33 |
| Control with AS#3 on upper and lower interface | 1515.08/1.09 | 3.0 | 0.34 |
| Dense NT on Si with AS#3 on lower interface | 1515.08/1.09 | 2.5 | 0.39 |

6. Example Thermal Switch Performance

FIG. 11A is a graph that illustrates a response of a mechanical thermal switch using copper plates as the thermal interfaces. The horizontal time axis 1102a indicates elapsed time from zero to about one hour after a maximum temperature difference has been built up between two separated thermal interfaces. The vertical temperature axis 1104a indicates the temperature of a thermal interface component in degrees Celsius (° C.).

The performance of such a switch was determined using the testing apparatus 300 of FIG. 3 with no sample. The measured thermal resistance $R_{CU}$ of the interface between the two copper blocks of 330, 340 was 36.31 K·cm$^2$/W. This thermal resistance is much higher than the resistance associated with carbon nanotubes shown in Table 1. The switch operation was determined by alternately separating the blocks 330, 340 and then bringing them into contact and then repeating this process for the duration of the demonstration.

The temperature of the heated copper block of heater/thermocouple 330 is plotted as heater trace 1110. The temperature of the copper block/thermocouple 340 connected to heat exchanger 350 is graphed as sink trace 1120. The heat exchanger was operated to maintain the temperature of the copper block/thermocouple 340 at 37° C.

As can be seen in FIG. 11A, the temperatures of the two copper blocks in 330, 340 approached each other during periods of contact, but did not converge to the same temperature. The heated block 330, represented by heater trace 1110, cooled from 155° C. to about 55° C. but then leveled off without reaching the 37° C. temperature of the heat sink block 340. The difference between the 55° C. temperature of the heated block 330 and the 37° C. temperature of the sink block 340 is due to the thermal resistance of the copper-copper interface. When the blocks were separated, the temperature of the heated block rose again, depending on the time that the blocks 330, 340 remained out of contact. Over the next five cycles, the heated block reached temperatures from over 80° C. to over 100° C. when contact was broken, and each time failed to cool to 37° C. when brought into contact with the sink block 340. Clearly, a copper-copper thermal interface is not adequate to completely cool a 1 W heat source.

FIG. 11B is a graph that illustrates a response of a mechanical thermal switch using carbon nanotubes, according to an embodiment. The horizontal time axis 1102b indicates elapsed time from zero to about 70 minutes after a maximum temperature difference has been built up between two separated thermal interfaces. The vertical temperature axis 1104b indicates the temperature of a thermal interface component in degrees Celsius (° C.).

The performance of such a switch is determined using the testing apparatus 300 of FIG. 3 with a sample made up of dense carbon nanotubes on a silicon substrate with AS#3 on its lower interface. The measured thermal resistance $R_{DNT}$ of the interface between the copper block of 330 and the dense nanotube sample on the copper block 340 was 3 K·cm$^2$/W, similar to the value listed in Table 1. The switch operation was realized by alternately separating the block 330 and the sample 380 and then bringing them into contact, and then repeating this process for the duration of the demonstration.

The temperature of the heated copper block of heater/thermocouple 330 is plotted as heater trace 1130. The temperature of the copper block/thermocouple 340 connected to sample 380 and the heat exchanger 350 is graphed as sink trace 1140. The heat exchanger was operated to maintain the temperature of the copper block/thermocouple 340 at 37° C.

As can be seen in FIG. 11B, the temperatures of the two copper blocks in 330, 340 converged to the same temperature during periods of contact. The heated block 330, represented by heater trace 1130, cooled from about 130° C. to about 37° C.—thereby reaching the temperature of the heat sink block 340. The convergence in temperature is due to the low thermal resistance of the dense nanotube interface. When the block 330 and sample 380 were separated, the temperature of the heated block rose again, depending on the time that the block 330 and sample 380 remained out of contact. Over the next five cycles, the heated block reached temperatures about 80° C. and each time cooled to 37° C. when brought into contact with the dense nanotubes. Clearly, a dense carbon nanotube thermal interface is sufficient to completely cool a 1 W heat source and far superior to a copper-copper interface.

FIG. 11B also indicates that the dense carbon nanotube thermal interface does not degrade during repeated contact with a copper thermal interface. Therefore a dense carbon nanotube thermal interface is suitable for a thermal switch that is repeatedly opened and closed.

6.1 Example Mechanical Thermal Switch

Figure 12A:
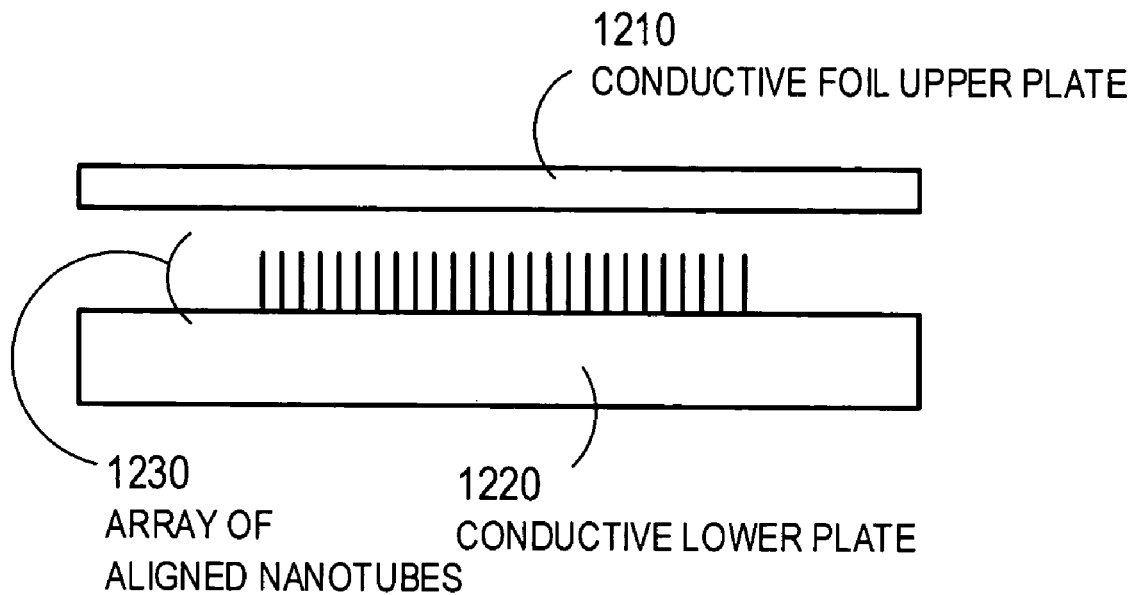
FIG. 12A and FIG. 12B are block diagrams that illustrate a mechanical thermal switch in a non-contact state and a contact state, respectively, according to an embodiment.
Figure 12B:
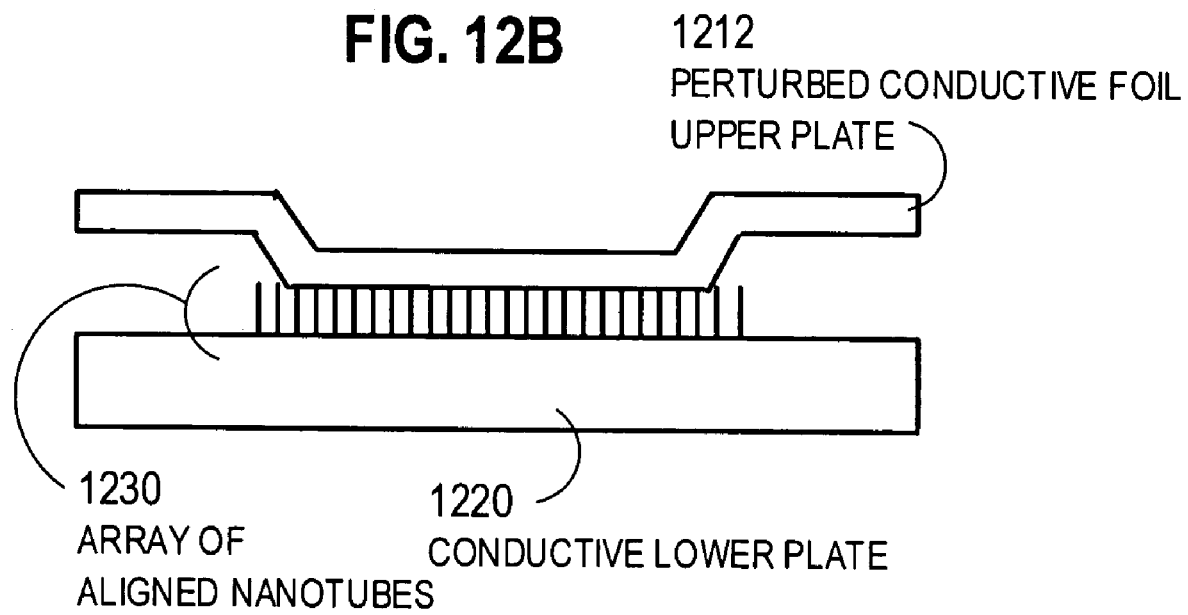

FIG. 12A and FIG. 12B are block diagrams that illustrate a mechanical thermal switch in a non-contact state and a contact state, respectively, according to an embodiment. In the illustrated embodiment, the mechanical switch includes an upper plate 1210 made of a malleable material that can be deformed under pressure and that conducts heat. In some embodiments paraffin (a non-conductive wax) is used to actuate the malleable material for the upper plate. The mechanical switch also includes a lower plate 1220 made of a thermally conductive material. Disposed on the lower plate 1220 is an array 1230 of aligned carbon nanotubes, such as dense carbon nanotubes condensed or grown onto the lower plate 1220 using methods 600, 900 described above. The conductive lower plate 1220 and array 1230 of aligned carbon nanotubes constitute a lower thermal interface.

As shown in FIG. 12B for a contact state, the upper plate 1210 of FIG. 12A is perturbed under pressure to form a perturbed upper plate 1212 that contacts the array 1230 of aligned carbon nanotubes on lower plate 1220. The pressure to deform the conductive foil upper plate 1210 may be provided in any manner known in the art. For example, a piezoelectric material that expands or contracts when supplied with an electric voltage may be used to perturb the conductive foil upper plate 1210. In some embodiments, the foil forms a diaphragm on a chamber that contains a gas or liquid (a fluid) that can expand or contract. For example, a gas that expands when heated can perturb the foil upper plate 1210, causing it to contact the array 1230 of carbon nanotubes.

6.2. Example Electrical Thermal Switch

Figure 13A:
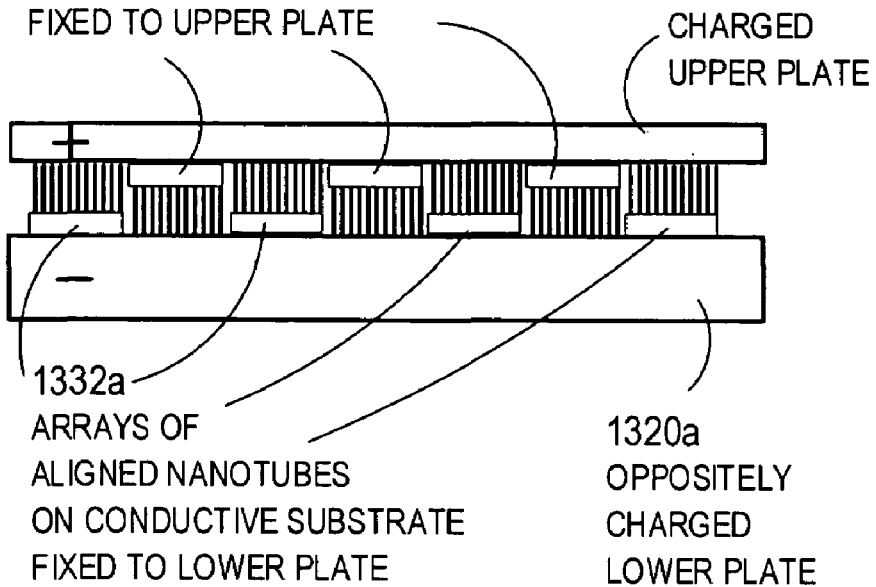
FIG. 13A and FIG. 13B are block diagrams that illustrate an electrical thermal switch in a contact state and a non-contact state, respectively, according to an embodiment.
Figure 13B:
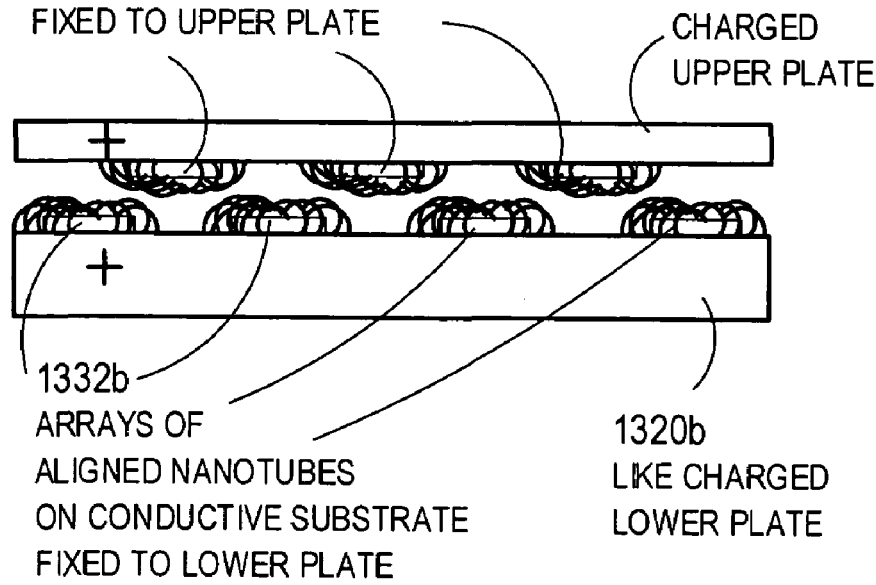

FIG. 13A and FIG. 13B are block diagrams that illustrate an electrical thermal switch in a contact state and a non-contact state, respectively, according to an embodiment. As shown in FIG. 13A, the electrical switch includes an electrically charged upper plate 1310a and an electrically charged lower plate 1320a. Fixed to each plate are several assemblies of aligned carbon nanotube arrays on thermally and electrically conductive substrates. As shown in FIG. 13A, arrays 1334a of aligned nanotubes on conductive substrates are fixed to electrically charged upper plate 1310a, and arrays 1332a of aligned nanotubes on conductive substrates are fixed to electrically charged lower plate 1320a.

In a contact state depicted in FIG. 13A, the upper and lower plates 1310a, 1320a are oppositely charged electrically, e.g., the upper plate 1310a is positively charged and the lower plate 1320a is negatively charged. The nanotubes electrically connected to one plate are repelled by that plate and attracted to the other plate. Consequently, the nanotubes take a shape that increases the distance from their unattached ends to the first plate and decreases the distance from their unattached ends to the oppositely charged plate. This brings the free ends of the nanotubes into thermal contact with the oppositely charged plate.

In a non-contact state depicted in FIG. 13B, the upper and lower plates 1310b, 1320b are charged the same electrically, e.g., the upper plate 1310b is positively charged and the lower plate 1320b is positively charged. The nanotubes electrically connected to one plate are repelled by both plates. Consequently, the nanotubes take a shape that increases the distance from their unattached ends to both plates. This removes the free ends of the nanotubes from thermal contact with the other plate and the switch is open. For example, the free ends of the arrays 1334b of nanotubes on conductive substrates fixed to the upper plate 1310b are repelled from the like charged lower plate 1320b and separate from that lower plate 1320b. Similarly, the free ends of the arrays 1332b of nanotubes on conductive substrates fixed to the lower plate 1320b are repelled from the like charged upper plate 1310b and separate from that upper plate 1310b.

In other embodiments, the arrays 1334 of aligned carbon nanotubes on conductive substrates are fixed to just one of the charged plates 1310a, 1320a or 1310b, 1320b. In some embodiments, the arrays of aligned carbon nanotubes are condensed or grown directly on the charged plates 1310a, 1320a or 1310b, 1320b.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A thermal interface comprising:
   a first structure for making thermal contact with a second, different structure; and
   a plurality of substantively aligned carbon nanotubes protruding substantively perpendicularly from a first surface of the first structure to improve thermal contact with the second structure, wherein
   a nanotube packing ratio is the quotient of the sum of cross section areas of carbon nanotubes in the plurality of carbon nanotubes divided by the area of the first surface of the first structure covered by the carbon nanotubes, and the nanotube packing ratio is greater than fifty percent.

2. The thermal interface as recited in claim 1, further comprising a plurality of metal catalyst particles fixed to the first surface, wherein each carbon nanotube in the plurality of carbon nanotubes is bound to a metal catalyst particle of the plurality of metal catalyst particles.

3. The thermal interface as recited in claim 2, wherein the plurality of metal catalyst particles is substantively regularly spaced on the first surface with a minimum spacing of less than about twenty nanometers center to center.

4. The thermal interface as recited in claim 3, wherein the plurality of metal catalyst particles is deposited on the first surface from a fluid surface of a Langmuir-Blodgett trough.

5. The thermal interface as recited in claim 2, wherein the plurality of metal catalyst particles is a plurality of iron nanoparticles, each iron nanoparticle having a diameter less than about twenty nanometers.

6. The thermal interface as recited in claim 5, wherein each iron nanoparticle has a diameter less than about five nanometers.

7. The thermal interface as recited in claim 2, wherein a metal catalyst for the plurality of metal catalyst particles is selected from the group consisting of iron, nickel and cobalt.

8. The thermal interface as recited in claim 1, further comprising the second structure mounted relative to the first structure for selecting between:
   a contact state in which the second structure contacts the plurality of carbon nanotubes at an operative pressure; and
   a non-contact state in which the second structure does not contact any carbon nanotube in the plurality of carbon nanotubes.

9. The thermal interface as recited in claim 8, wherein the length of a particular carbon nanotube in the plurality of carbon nanotubes is matched to the distance between the first surface of the first structure and a first surface of the second structure in the contact state.

10. The thermal interface as recited in claim 9, wherein the length of the particular carbon nanotube is determined by pressing the second structure against the plurality of carbon nanotubes at a formation pressure that exceeds the operative pressure.

11. The thermal interface as recited in claim 8, wherein the second structure is moveably mounted relative to the first structure.

12. The thermal interface as recited in claim 8, wherein the second structure is selectively electrically charged relative to the first structure.

13. The thermal interface as recited in claim 1, wherein the diameter of each nanotube in the plurality of carbon nanotubes is less than about twenty nanometers.

14. The thermal interface as recited in claim 1, wherein the length of each nanotube in the plurality of carbon nanotubes is in a range from about eight micrometers to about ten micrometers.

15. A thermal switch comprising:
   a first structure;
   a plurality of carbon nanotubes substantively aligned perpendicularly from a first surface of the first structure; and
   a second structure mounted relative to the first structure for selecting among a plurality of states, including a contact state in which the second structure contacts the plurality of carbon nanotubes at an operative pressure and a non-contact state in which the second structure does not contact any carbon nanotube in the plurality of carbon nanotubes,
   wherein the plurality of substantively aligned carbon nanotubes have been pretreated by bringing the second structure into contact with the plurality of substantively aligned carbon nanotubes under a pretreatment pressure substantively greater than the operative pressure.

16. A method for fabricating a thermal switch operated by repeatedly alternating between separating a first interface from a second interface and pressing the first interface and the second interface together at an operative pressure, comprising the steps of:
   forming a first interface including an array of carbon nanotubes;
   forming a second interface;
   pressing the first interface and the second interface together at a pretreatment pressure substantially greater than the operative pressure; and
   separating the first interface from the second interface.

17. A thermal switch comprising:
   a first structure;
   a plurality of carbon nanotubes substantively aligned perpendicularly from a first surface of the first structure; and
   a second structure mounted relative to the first structure for selecting among a plurality of states, including a contact state in which the second structure contacts the plurality of carbon nanotubes and a non-contact state in which the second structure does not contact any carbon nanotube in the plurality of carbon nanotubes.

* * * * *